(12) United States Patent
Miura et al.

(10) Patent No.: US 7,804,298 B2
(45) Date of Patent: Sep. 28, 2010

(54) NUCLEAR MAGNETIC RESONANCE MEASURING METHOD FOR SOLID SAMPLES

(75) Inventors: Iwao Miura, Tokushima (JP); Masahiro Miyake, Tokushima (JP)

(73) Assignee: Otsuka Pharmaceutical Co., Ltd., Tokyo (JP)

( * ) Notice: Subject to any disclaimer, the term of this patent is extended or adjusted under 35 U.S.C. 154(b) by 667 days.

(21) Appl. No.: 11/658,468

(22) PCT Filed: Jul. 27, 2005

(86) PCT No.: PCT/JP2005/013764
§ 371 (c)(1),
(2), (4) Date: Jan. 25, 2007

(87) PCT Pub. No.: WO2006/011528
PCT Pub. Date: Feb. 2, 2006

(65) Prior Publication Data
US 2009/0033325 A1 Feb. 5, 2009

(30) Foreign Application Priority Data
Jul. 29, 2004 (JP) .............................. 2004-222440

(51) Int. Cl.
*G01V 3/00* (2006.01)
(52) U.S. Cl. ...................................... 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 4,438,400 A | 3/1984 | Patt | |
| 6,479,994 B1 | 11/2002 | Hills et al. | |
| 6,693,190 B1 * | 2/2004 | Ranganathan et al. | 540/465 |
| 7,276,904 B2 * | 10/2007 | Busse et al. | 324/309 |
| 2008/0197840 A1 * | 8/2008 | Van Zijl et al. | 324/307 |

FOREIGN PATENT DOCUMENTS

JP         51-40981         4/1976

(Continued)

OTHER PUBLICATIONS

Edited by CSJ: The Chemical Society of Japan, Jikken Kagaku Koza 5 NMR, 4th Edition, pp. 18-19, 26 and 27, Apr. 25, 1994.
Song et al., "Nondestructive Measurement of Transient Moisture Profiles in Ear Corn During Drying Using NMR Imaging", American Society of Agricultural Engineers, vol. 33(4), pp. 1286-1290, (1990).
Zumbulyadis et al., "Elucidation of Polymorph Mixtures Using Solid-State $^{13}$C CP/MAS NMR Spectroscopy and Direct Exponential Curve Resolution Algorithm", Journal American Chemical Society, vol. 121, pp. 11554-11557, (1999).

(Continued)

*Primary Examiner*—Brij B Shrivastav
(74) *Attorney, Agent, or Firm*—Finnegan, Henderson, Farabow, Garrett & Dunner, L.L.P.

(57) ABSTRACT

In the IR (Inversion Recovery) method, to observe a phenomenon in which a nuclear spin returns to a steady state, a 90-degree pulse is irradiated after a lapse of time τ after finishing applying a 180-degree pulse. An FID signal starts being processed after a lapse of reception delay time Dd after finishing applying the 90-degree pulse. Among the FID signals from protons in a plurality of environments in a solid sample, an FID signal high in time-dependent attenuation rate almost disappears during the lapse of reception delay time Dd. Therefore, an FID signal of a proton in an environment intended to be measured can be easily selected and extracted from FID signals of other protons.

12 Claims, 6 Drawing Sheets

FOREIGN PATENT DOCUMENTS

| | | |
|---|---|---|
| JP | 51-29677 | 8/1976 |
| JP | 4-364490 | 12/1992 |
| JP | 6-19425 | 3/1994 |
| JP | 08-164119 | 6/1996 |
| JP | 3499939 | 12/2003 |
| JP | 3542598 | 4/2004 |
| WO | WO 94/12891 | 6/1994 |
| WO | WO 99/42852 | 8/1999 |

OTHER PUBLICATIONS

Smernik et al., "Virtual Fractionation of Charcoal From Soil Organic Matter Using Solid State $^{13}$C NMR Spectral Editing", Aust. J. Soil Res., vol. 38 pp. 665-683, (2000).

Tang et al., "$^{13}$C CPMAS Studies of Plant Cell Wall Materials and Model Systems Using Proton Relaxation-Induced Spectral Editing Techniques", Solid State Nuclear Magnetic Resonance, vol. 15, pp. 239-248, (2000).

Windig et al., "Applications and New Developments of the Direct Exponential Curve Resolution Algorithm (DECRA). Examples of Spectra and Magnetic Resonance Images", Journal of Chemometrics, vol. 13, pp. 95-110, (1999).

M.R.G. Coelho et al., "Carbon-13 High-Resolution Solid State NMR Study of Polybutadiene," Polymer Testing 15 (1996) 485-490, XP-002502225.

Yong Yue et al., $^{23}$Na NMR studies of doped nasicon systems, Chemical Physics Letters 235 (1995) 503-507, XP-002502226.

B.M. Fung et al., "Line Narrowing in Solid-State Proton NMR with Acquisition Delay," Journal of Magnetic Resonance, Series A 123, 56-63 (1996) Article No. 0213, XP-002502227.

C.H.A. Seiter et al., "Delayed Fourier Transform Proton Magnetic Resonance Spectroscopy," Journal of the American Chemical Society, vol. 94, 1972, 2535-2537, XP-002502228.

NMR course, Lecture 3, The Fundamental Theories of NMR, Part II, [Online] 1999, pp. 1/1; 1/15-3/15 and 10/13-13/13, XP-002502229.

Supplementary European Search Report dated Dec. 2, 2008.

International Preliminary Report on Patentability dated Jan. 30, 2007—International Application No. PCT/JP2005/013638.

International Preliminary Report on Patentability dated Jan. 30, 2007—International Application No. PCT/JP2005/013764.

Juha T. Timonen et al., "A $^{31}$P CP/MAS NMR Study on Dehydration of Disodium Clodronate Tetrahydrate," *Pharmaceutical Research*, vol. 15, No. 1 1998, pp. 111-115.

\* cited by examiner

NUCLEAR MAGNETIC RESONANCE MEASURING METHOD FOR SOLID SAMPLES

TECHNICAL FIELD

The present invention relates to a nuclear magnetic resonance measuring method for solid samples in which a nuclear spin of a solid sample placed in a static magnetic field is excited by use of a receiver coil, and then an FID (Free Induction Decay) signal emitted from the thus excited nuclear spin is received, and is then subjected to a frequency conversion process, thereby obtaining an IR (Inversion Recovery)-NMR (Nuclear Magnetic Resonance) spectrum.

BACKGROUND ART

In recent years, a near-infrared (NIR) spectroscopy method, a powder X-ray diffraction method, or a solid CMR method has been used as a method for physically measuring a solid sample. However, these measuring methods are disadvantageous, for example, in that a quantitative analysis cannot be performed without references, that the detection limit is high, that the signal strength depends on a crystal size, and that a specific crystal form, such as an amorphous form, cannot be detected.

On the other hand, a proton NMR (PMR) method has been widely used as a means for measuring a sample dissolved in a solution.

Protons have a high natural abundance ratio, and are higher in detection sensitivity than other elements, and hence are suitable for analysis.

The PMR method is performed such that protons placed in a static magnetic field are irradiated with an RF magnetic field, and that the energy change of the protons resonant with the RF magnetic field is recorded as an electric signal.

The principle of the proton nuclear magnetic resonance is as follows.

An atomic nucleus has a minute magnet (spin magnetic moment). The spin magnetic moment of a proton placed in a non-magnetic environment faces a random direction. When this is placed in a static magnetic field (+Z direction), the magnetic moment starts Larmor precession at a slightly oblique angle with respect to an axis H0 of the magnetic field. Its angular velocity $\omega 0$ is proportional to the magnetic field strength H0.

$$\omega 0 = (\gamma/2\pi)H0$$

The symbol $\gamma$ is called a gyromagnetic ratio, and is an intrinsic constant of a nuclide. The rotational phase is in disorder, and is uniformly distributed in a vertically conical shape.

Groups in the up-direction are excessive in the magnetic field, and the resultant vector M of these groups follows the +Z direction. These are spin groups that are treated as a subject of the NMR phenomenon.

To obtain an NMR signal, a radio wave having the same angular velocity as that of the precession movement is irradiated from the X axis.

As a result, the spin groups absorb the energy of the radio wave to bring about vector components Mx and My. An NMR signal can be obtained by detecting the vector component My by use of a receiver coil placed in the y-direction.

If the radio wave is a pulse, reference is made to as the irradiation of, for example, a 90-degree pulse or a 180-degree pulse. Tilt angle values, such as 90 degrees or 180 degrees, are specified by an angle at which a spin is inclined from the +Z direction. The tilt angle can be changed by pulse width (microseconds) and pulse strength.

An electric current detected by the receiver coil is called "FID" (Free Induction Decay), and its strength is maximized when irradiated pulses are cut, and is attenuated with the lapse of time.

The orbit of a magnetic moment M during a relaxation process is provided by recording the strength of an electric current produced by a detector coil when a 90-degree pulse is irradiated. This measuring method is called an IR (Inversion Recovery) method.

Especially, a pulse sequence of $(180°\text{-}\tau\text{-}90°)n$ is often used in this method, and is also applied to, for example, a study of the properties of a compound or to MRI in the medical field.

The IR method using this pulse sequence of $(180°\text{-}\tau\text{-}90°)n$ will be explained.

The directions of magnetic moments of proton spins in a steady state coincide with the Z direction. Therefore, the resultant vector thereof is present at +Zo. The irradiation of a 180-degree pulse thereonto allows the direction of the proton spins to make a 180-degree inversion and hence to face the −ZO direction.

To record this state, a 90-degree pulse is irradiated after the lapse of $\tau$ seconds after completing the irradiation of the 180-degree pulse. The vector takes a 180°+90° position (270-degree position) if it is immediately after the irradiation of the 180-degree pulse. Therefore, the NMR signal becomes a maximum minus signal.

If the pulse sequence of $(180°\text{-}\tau\text{-}90°)n$ is irradiated a plurality of times while changing the value $\tau$ so as to record a change in the NMR signal with respect to the value $\tau$, a longitudinal relaxation curve that results from a single proton and is drawn according to the following equation can be obtained:

Signal strength $y = [1 - 2\exp(-\tau/T1)]$ where T1 is the time during which the nuclear spin facing the −ZO direction returns to the initial state of facing the +ZO direction, and is called the spin-lattice relaxation time or the longitudinal relaxation time (T1).

FIG. 7 graphs this longitudinal relaxation curve.

The value of the longitudinal relaxation curve recovers to be signal strength of zero after 0.693T1 seconds, and reaches a substantially saturated state after 5T1 seconds.

The value of T1 gives an intrinsic value to a proton environment, and hence can be used to obtain information about a molecule. For example, the value of T1 reflects a molecule-to-molecule distance in powder, and can be used as information showing a difference in the molecular structure.

In a process in which the NMR signal is received, a coil-induced electric current disappears with the progression of transverse relaxation immediately after finishing the irradiation of the 90-degree pulse. An FID (Free Induction Decay) signal is the one that records this, and is a time-domain spectrum signal when the abscissa axis shows time. The FID signal is attenuated by $\exp(-/T2)$ where T2 is called the transverse relaxation time depending on an environment in which protons are placed, and is a piece of chemically important information.

A so-called NMR spectrum whose abscissa axis shows a frequency domain can be detected by subjecting this FID signal to a Fourier transform.

Non-patent literature 1: Journal of American Chemical Society 121, 11554-11557 (1999)

Non-patent literature 2: Australian Journal of Soil Research 38, 665-683 (2000)

Non-patent literature 3: Solid State Nuclear Magnetic Resonance 15, 239-248 (2000)

Non-patent literature 4: Journal of Chemometrics 13, 95-110 (1999)

DISCLOSURE OF THE INVENTION

Problems to be Solved by the Invention

It has been common knowledge that the IR-NMR method mentioned above is unsuitable for the measurement of solid samples.

According to the conventional IR-NMR method, a spectrum signal of an FID signal is influenced by protons of water molecules contained in a solid sample, so that other necessary proton signals cannot appear clearly.

Presumably, the reason is that protons occupying various parts of a crystal molecule have mutually different transverse relaxation times T2 in the solid sample, and hence signals having a plurality of transverse relaxation times T2 are intermingled with the FID signal.

Therefore, even if this is examined according to the IR method, only the FID signal in which transverse relaxation times T2 are mixed together and are averaged will be obtained.

It is therefore an object of the present invention to provide a nuclear magnetic resonance measuring method for solid samples that is capable of selectively measuring a specific proton in a molecule when an IR-NMR spectrum is measured in such a manner that a cell is placed in a receiver coil of an NMR signal and then a solid sample is inserted into this cell.

The present inventor has paid attention to the fact that information concerning a proton occupying a specific part can be obtained if only an NMR signal of transverse relaxation time T2 within a certain range can be taken in as an FID signal.

Therefore, if a solid sample to be measured comprises a mixture of substances that are the same in composition and are different in crystal structure (including an amorphous form), which are called crystal polymorphs, a component ratio thereof or the like can be specified based on the proton information mentioned above.

It is therefore another object of the present invention to provide a nuclear magnetic resonance measuring method for solid samples that is capable of measuring an abundance ratio of constituents, such as crystal polymorphic constituents or amorphous constituents, that are present in a solid sample in such a manner that an IR-NMR spectrum is analyzed so as to obtain information concerning a proton occupying a specific part.

Means for Solving the Problems

The solid sample nuclear magnetic resonance measuring method of the present invention is a method including a step of applying a nuclear-spin exciting pulse onto a solid sample inserted in a cell in a magnetic field, a step of applying a reading pulse after an interval of time τ, and a step of starting the integration of the FID signals after a lapse of reception delay time Dd after finishing applying an FID signal reading pulse.

A 180-degree pulse is often used as the exciting pulse, and a 90-degree pulse is often used as the reading pulse. However, the present invention is, of course, not limited to the value of 180 degrees or 90 degrees mentioned above.

An exciting-τ-reading pulse is used to measure the proton relaxation time. A first exciting pulse makes a proton energy state high. Thereafter, the energy level of the proton decreases, and an NMR signal is gradually changed from a minus signal to a plus signal. Finally, that returns to a steady state. To observe the phenomenon of returning to the steady state, a reading pulse is irradiated after a lapse of time τ after finishing applying an exciting pulse.

If the FID signals are integrated without an interval of reception delay time Dd after finishing applying the reading pulse, the following problem will occur. Among FID signals from protons in a plurality of environments in a solid sample, the ones having high signal strength are picked up. These signals are mixed together, and it becomes difficult to extract an FID signal from a proton in an environment intended to be measured.

Therefore, according to the present invention, the FID signals start being integrated after a lapse of reception delay time Dd.

As a result, among the FID signals from protons in a plurality of environments in a solid sample, an FID signal high in the time-dependent attenuation rate almost disappears during the lapse of reception delay time Dd, and hence an FID signal of a proton in an environment intended to be measured can be easily selected and extracted from FID signals from other protons.

Preferably, the reception delay time Dd is set at a value falling within a range of 1 to 20 microseconds, and, more preferably, 5 to 20 microseconds. If about 20 microseconds elapse, the FID signals of most protons will disappear. Therefore, there is little advantage in setting the reception delay time Dd to be longer than this.

More preferably, the reception delay time Dd is set at a value falling within a range of 10 to 15 microseconds.

Preferably, a water molecule trapping mechanism used to catch water being present in a sample and in a chamber and catch free water infiltrating from the outside is disposed in or near a cell.

The reason is that, in many cases, amorphous substances in a sample to be measured are high in the hygroscopic degree, and hence it is preferable to perform measurement in a sealed system having only a little water. FID signals from protons not deriving from water can be received with high sensitivity by lessening FID signals from protons deriving from water.

As described above, according to the present invention, FID signals from protons in an environment intended to be measured can be selected and extracted from FID signals from other protons, and an analysis of this spectrum waveform makes it possible to easily analyze the crystal polymorph of a solid sample.

Additionally, the solid sample nuclear magnetic resonance measuring method of the present invention is a method including a step of acquiring a plurality of FID signals while changing a period of time τ, a step of calculating IR-NMR spectra based on these plurality of FID signals, a step of obtaining a longitudinal relaxation curve by plotting spectrum strength with respect to time τ in a specific frequency of the IR-NMR spectrum, and a step of estimating a constituent ratio of constituent substances of the solid sample by making a regression analysis while regarding the longitudinal relaxation curve as a total sum of a plurality of longitudinal relaxation curves differing in longitudinal relaxation time.

In the present invention, when a solid sample to be measured comprises crystal polymorphic mixtures, the constituent ratio, or the like, thereof can be specified since the longitudinal relaxation time T1 of a proton is used as a value that evaluates the motility of each constituent.

A near-infrared (NIR) spectroscopy method makes an analysis by eliciting extremely complex principal constituents, whereas the analysis object of the present method is a mathematical curve shown only by the value of longitudinal relaxation time T1. The present method is incomparably superior in simplicity to the NIR spectroscopy method. Moreover, according to the present method, the constituent ratio can be calculated even if no reference is provided.

Accordingly, solid crystal polymorphic substances including amorphous molecules can be quantified with high accuracy without requiring an expensive apparatus.

In the present invention, to determine the constituent ratio of a solid sample, the longitudinal relaxation curve is analyzed according to, for example, the nonlinear least-squares method, thus calculating strength coefficients f with respect to respective constituents. The constituent ratio is represented by the ratio between these strength coefficients f.

Additionally, the constituent ratio of the solid sample and the longitudinal relaxation time of each constituent can be calculated simultaneously.

The actual movement of a magnetization vector of an FID signal observed in the nuclear magnetic resonance measuring method is a rotational movement. What is required to transform this into a frequency spectrum is an angle (0th-order phase value; PhC0) from an observing direction to a first observation point and an angle (1st-order phase value; PhC1) from the first observation point to a second observation point. Therefore, in the present invention, a correct 0th-order phase can be found, and an FID signal that has undergone a phase adjustment can be obtained by simultaneously adjusting the 0th-order phase and the baseline. A correct frequency spectrum can be obtained by subjecting this to a Fourier transform.

There is a case in which an obtained frequency spectrum includes nonnegligible noise. In this case, if a digital smoothing filter is used for the IR-NMR spectrum, a frequency spectrum from which noise has been removed can be obtained.

Additionally, if a smoothing process is pre-applied to the time axis in a step of measuring the FID signal, a frequency spectrum from which noise has been removed can be effectively obtained.

Additionally, a longitudinal relaxation curve that is not influenced by instantaneous noise can be obtained if a longitudinal relaxation curve is produced by using an integral value of spectrum strength in a specific frequency range instead of spectrum strength in the "specific frequency" when the longitudinal relaxation curve is obtained by plotting spectrum strength with respect to time τ in a specific frequency of the IR-NMR spectrum. Therefore, the constituent ratio of each constituent substance of the solid sample can be accurately estimated.

The above and other advantages, features, and effects of the present invention will become apparent by the following description of embodiments given with reference to the accompanying drawings.

DESCRIPTION OF SYMBOLS

Figure 1:
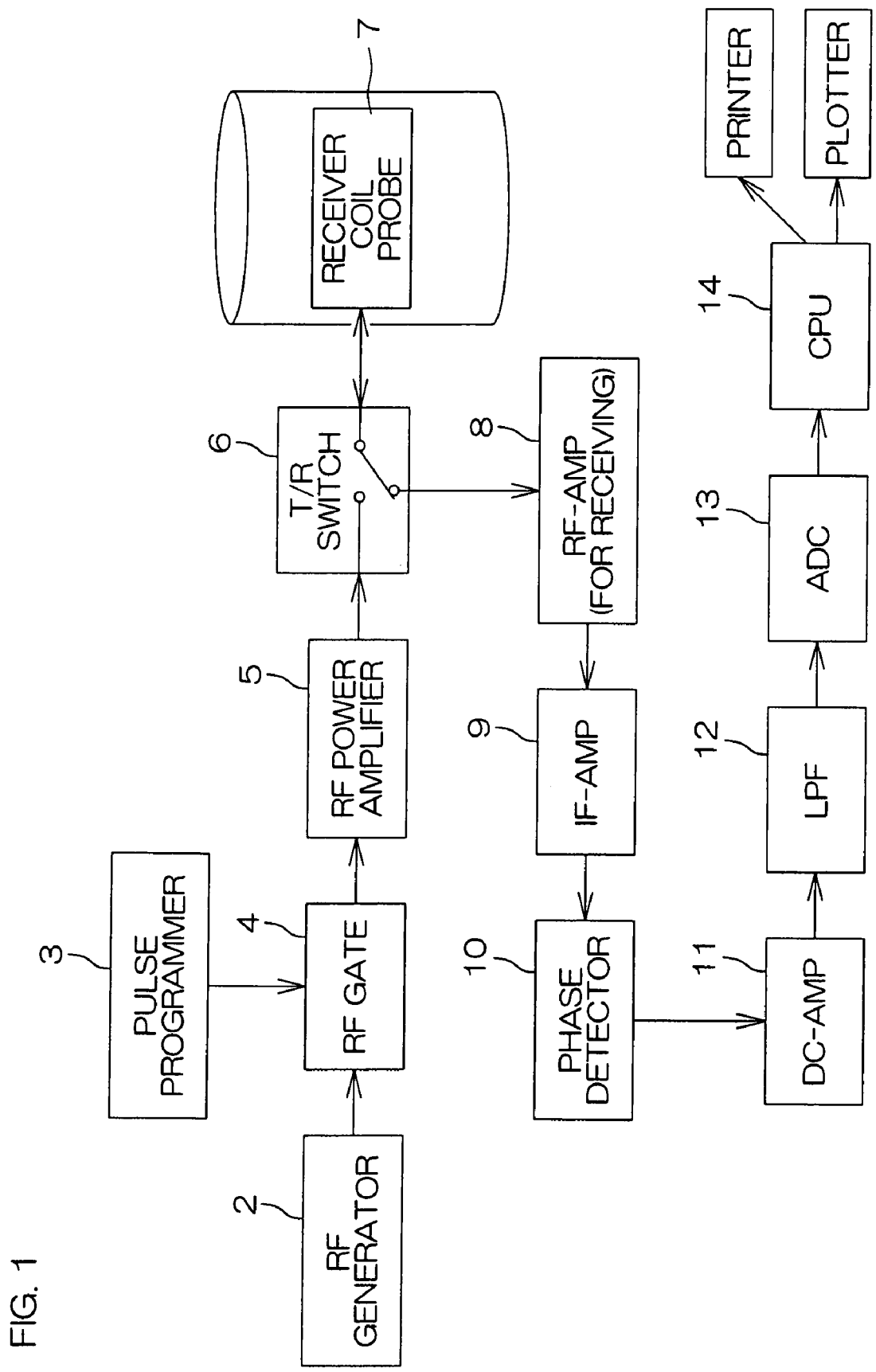
FIG. 1 is a system block diagram of a measuring apparatus that performs a solid-sample nuclear magnetic resonance measuring method of the present invention.

2 RF generator
3 Pulse programmer
4 RF gate
5 RF power amplifier
6 T/R switch
7 Receiver coil
8 RF-AMP
9 IF-AMP
10 Phase detector
11 DC-AMP
12 Low-pass filter
13 A/D converter
14 CPU
21 Sample tube
23 Cap
24 Resin tube
27 Container
28 Capacitor
29 NMR measuring chamber
30 Tuning circuit board
31 Terminal

BEST MODE FOR CARRYING OUT THE INVENTION

FIG. 1 is a block diagram of an NMR measuring apparatus for performing a solid-sample nuclear magnetic resonance measuring method of the present invention.

The NMR measuring apparatus includes an RF generator 2 that generates a series of high frequency signals having a constant frequency (300 MHz, for example), a pulse programmer 3 that generates a pulse signal for modulation, such as a 90-degree pulse or a 180-degree pulse, an RF gate 4 that applies pulse modulation to a high frequency signal generated by the RF generator, and an RF power amplifier 5 that amplifies a high frequency signal that has undergone pulse modulation up to a few tens of watts.

A high-frequency pulse signal amplified by the RF power amplifier 5 passes through the T/R switch 6 in a transmitting mode, and is applied to the receiver coil 7. The high-frequency pulse signal applied to the receiver coil 7 is irradiated onto a sample inserted in the receiver coil 7.

Resulting from the irradiation of the high-frequency pulse signal, an RF electric current produced in the receiver coil 7 by means of the flip of the proton spin of the sample passes through the T/R switch 6 in a receiving mode, then passes through the RF-AMP 8 and the IF-AMP 9, and enters the phase detector 10. This signal received thereby is a time-domain FID signal.

The FID signal that has been subjected to phase detection by the phase detector 10 becomes a signal residing in an audible frequency range. After this FID signal passes through the DC-AMP 11, an RF component of the FID signal is removed in the low-pass filter 12. After passing through the A/D converter 13, the FID signal is input into the CPU 14 in the form of a time-domain digital signal, and is stored in a given memory.

The time-domain digital signal stored in the memory of the CPU 14 is subjected to a Fourier transform in the CPU 14, and then becomes a so-called frequency-domain NMR spectrum signal.

Figure 2:
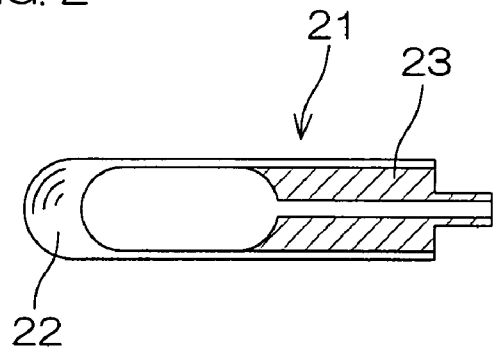
FIG. 2 is a longitudinal sectional view showing a sample tube 21 in which a sample that is a solid powder is placed.

FIG. 2 shows a sample tube 21 in which a sample that is a solid powder is placed. The sample tube 21 comprises a thick glass tube 22 and a resinous cap 23 with which the entrance of the tube is closed. For example, tetrafluoroethylene resin can be used as the above-mentioned resin.

To place a sample in the sample tube 21, the sample is first inserted into the glass tube 22, and then the entrance of the glass tube 22 is closed with the cap 23. The cap 23 has a small hole through which water is passed. A resin tube leading to a dehydrating agent described later is connected to this small hole.

Figure 3:
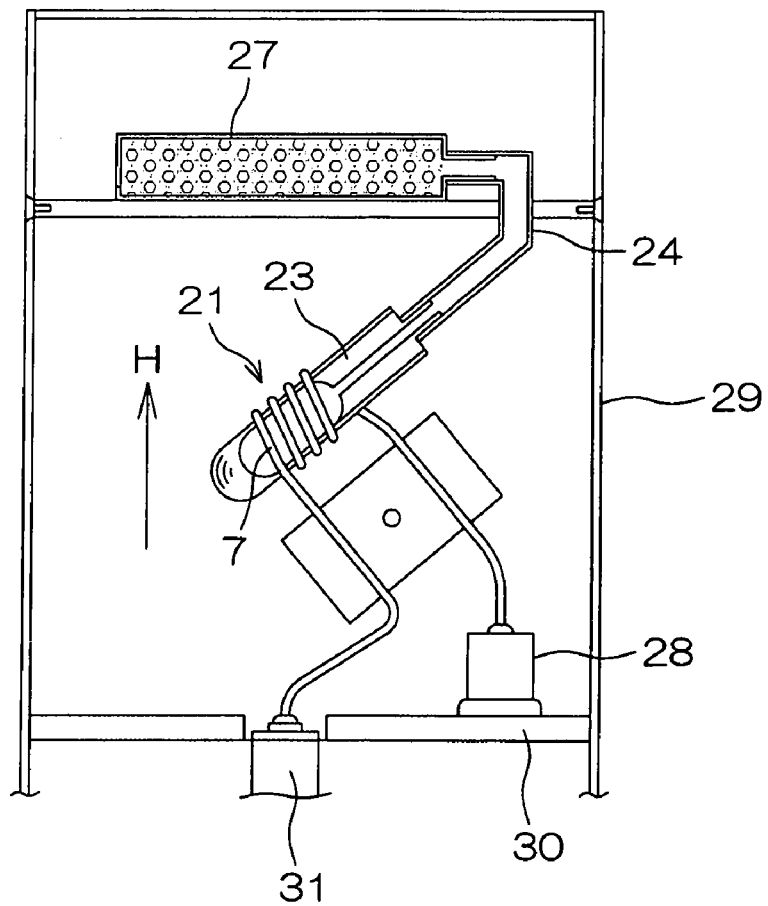
FIG. 3 shows an internal structure of an NMR measuring chamber 29.

FIG. 3 shows the inside of an NMR measuring chamber 29. The NMR measuring chamber 29 is filled with a gas, such as air or nitrogen. A magnetic field H vertically penetrates the inside of the measuring chamber.

The sample tube 21 including a sample is slantingly disposed in the NMR measuring chamber 29. A resin tube 24 is inserted into the cap 23 fitted on the sample tube 21.

A change in temperature influences the longitudinal relaxation time, and hence it is recommended to control the sample tube 21 so that the sample tube 21 maintains a constant temperature. Additionally, there is a need to measure all samples, between which a comparison is attempted, at the same temperature.

To measure a sample susceptible to water, a container 27 holding a desiccant is disposed at the upper part of the NMR measuring chamber 29. The end of the resin tube 24 of the sample tube 21 is connected to the container 27 holding the desiccant. Accordingly, a hydrate can be prevented from being produced during the measurement, and data in which the influence of added water is negligible can be obtained. The sample tube 21 may be sealed up without using a desiccant.

The sample tube 21 is placed so that the sample coincides with the center part of the receiver coil 7 wound like a solenoid. Terminals of the receiver coil 7 are connected to a capacitor 28 of a tuning circuit board 30 attached to the chamber 29 and another terminal 31, respectively.

Figure 4:
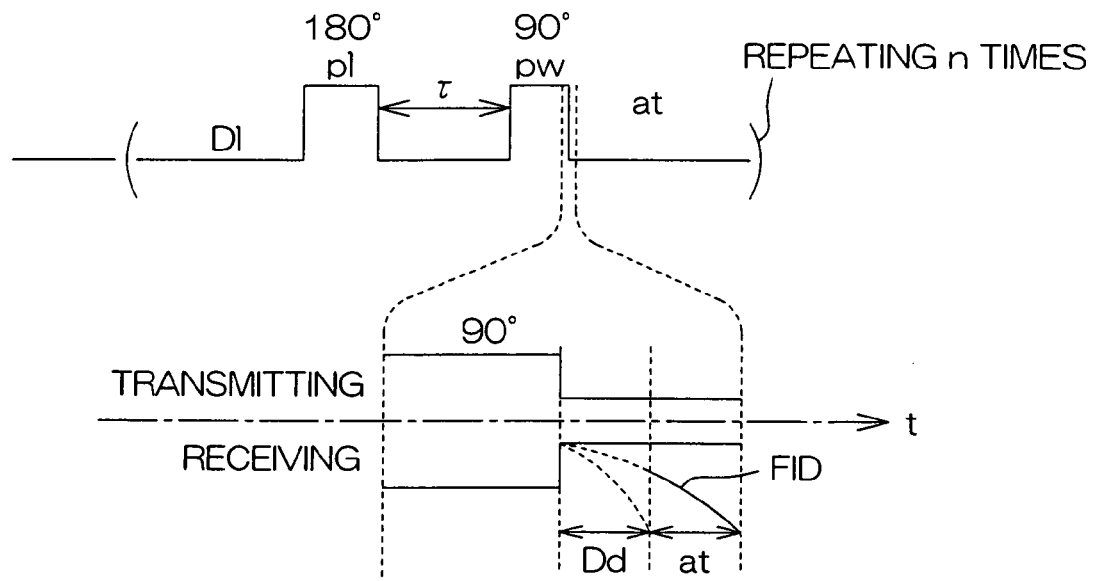
FIG. 4($a$) shows the waveform of a high frequency signal supplied to a receiver coil 7 and the waveform of a receiver FID signal, and FIG. 4($b$) is a graph showing an FID signal that has been observed and that has not yet undergone a phase adjustment.
Figure 4:
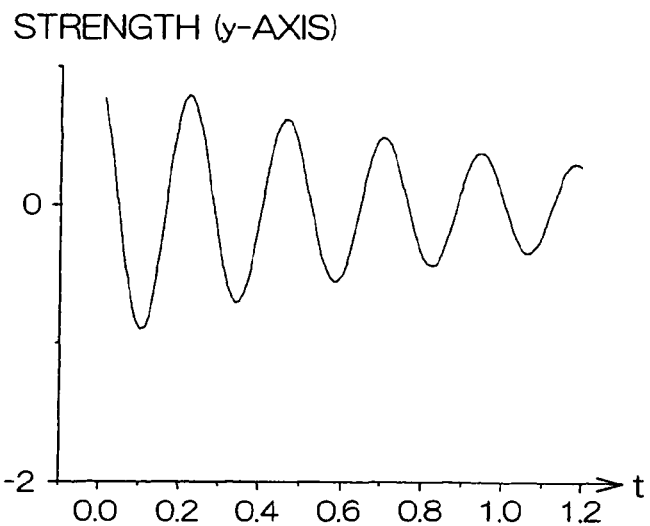

FIG. 4(a) shows the waveform of a high frequency signal supplied to the receiver coil 7 and the waveform of a receiver FID signal.

A 180-degree pulse signal is first supplied to the receiver coil 7. As a result, the energy state of a proton residing in the sample reaches a so-called high-energy state, and the directions of magnetic moments simultaneously make a 180-degree reversal in the minus direction.

Thereafter, a transmitting operation is stopped for τ seconds. The energy level is lowered by the longitudinal relaxation during this period of τ seconds.

Thereafter, a 90-degree pulse is irradiated in order to observe a phenomenon in which the proton returns to a steady state.

After irradiating the 90-degree pulse, the system of measurement is set to a receiving mode, and the waveform of a receiver FID signal generated by the receiver coil 7 is observed.

In the present invention, after entering the receiving mode, the computer starts storing the receiver FID signal after an interval of reception delay time Dd. Therefore, signals collected until the reception delay time Dd elapses after having entered the receiving mode are excluded from storage. The reception delay time Dd is fixed during the measurement.

If the reception delay time Dd is set to be too short, a case will occur in which noise is mixed into the neighborhood of the center of the frequency spectrum, and hence a weak signal will be hidden. Therefore, it is recommended to set the reception delay time Dd to be long. If the reception delay time Dd is set to be too long, the signal strength will be weakened. Therefore, the reception delay time Dd is set to fall within a suitable range (for example, 5 to 20 microseconds, preferably 10 to 15 microseconds). Accordingly, the ratio between the spectrum strength (i.e., signal) and an unnecessary signal (i.e., noise) is set to reach a maximum.

The stored receiver FID signal is subjected to a Fourier transform by the computer so as to show a frequency-domain NMR signal waveform. This NMR signal waveform is output and recorded.

The pulse sequence of (180°-τ-90°) mentioned above may be applied onto a piece of τ only once or n times. If the pulse sequence is applied only once, the time-domain digital signal input to the CPU 14 is subjected to the Fourier transform without changes. On the other hand, if the pulse sequence is applied n times, the time-domain digital signal input to the CPU 14 is averaged n times, and is then subjected to the Fourier transform. The latter case is preferable, because values remote from a mean value can be excluded by averaging the receiver FID signal although more measuring time is consumed.

After finishing applying the pulse sequence of (180°-τ-90°) once or n times, another pulse sequence of (180°-τ-90°), in which the value of has been changed, is again applied once or n times. A pulse sequence of (180°-τ-90°) is applied in this way while changing the vale of τ little by little from zero to the period about five times that of the longitudinal relaxation time T1.

A receiver FID signal waveform in which time τ is a variable can be obtained through this process. The computer subjects this receiver FID signal waveform to a Fourier transform, and obtains a frequency spectrum waveform.

A desirable signal processing method will be described here.

It is permissible that the FID signal obtained as above is multiplied by a window function, such as Exponential or Gaussian, having suitable strength so as to remove a noise component, and then a Fourier transform is applied.

In most cases, a frequency spectrum obtained by the Fourier transform is accompanied by a distortion in the baseline.

The observed FID signal is like the one of FIG. 4(b) in appearance. However, this is obtained by observing the rotational movement of a magnetization vector from one direction. The actual movement is a rotational one. What is needed to convert this into a spectrum is an angle to a first observation point from an observing direction (0th-order phase value; PhC0) and an angle from the first observation point to a second observation point (1st-order phase value; PhC1). A correct frequency spectrum can be obtained by subjecting this to a Fourier transform.

Therefore, a tentative phase adjustment is made with respect, to the FID signal by use of an intrinsic 1st-order phase value of a measurement condition and a 0th-order phase value that can be roughly set from the strength of both ends of a spectrum.

The 1st-order phase value used here can be obtained by adjusting the phase so that an extreme change in spectrum shape dose not occur in a range on which the influence of a return signal is exerted and in a range on which the influence of a return signal is not exerted by use of a spectrum measured with an appropriate digital filter. Once this value is set, the same value can be used unless the measurement condition (take-in condition) is changed.

Unlike the 1st-order phase value, the 0th-order phase value is not constant, depending on measurement. There is a possibility that this will be gradually and continuously changed even during a series of measurements. Therefore, a 0th-order phase adjustment is precisely performed with respect to a spectrum in which 1st-order and 2nd-order phase adjustments have been tentatively performed.

This precise 0th-order phase adjustment is performed simultaneously with the calculation of a distorted baseline of the spectrum. Let the real part of the spectrum that has undergone a phase adjustment be $r_0$, let the imaginary part thereof be $i_0$, and let the 0th-order phase value to be corrected from the current state be PhC0. The real part r of the spectrum that has undergone the true phase adjustment is expressed as follows.

$$r = r_0 \cos(PhC0) - i_0 \sin(PhC0)$$

For example, a baseline making a sin curve that can be regarded as resulting from the inaccuracy of signal strength occurring immediately after the start of a take-in operation can be applied as the distorted baseline. In this case, the baseline basl is expressed with respect to frequency x as follows.

$$basl = A + B \sin(Cx + D)$$

The sin curve has been mentioned as one example, and hence other baseline functions can be likewise used according to circumstances.

The five coefficients PhC0, A, B, C, and D are calculated according to the least squares method so that the two values (r and basl) coincide with each other in the best manner at the outer part of the spectrum. If a sample has difficulty in finding a specific baseline pattern, a phase correction may be performed so that the outside of a typical frequency spectrum is regarded as a baseline pattern and other frequency spectra become analogous to this.

Since the value of PhC0 calculated in this way fluctuates through the influence of noise, corrections are made by being estimated from the preceding and subsequent values so as to create a continuous change, and an accurate 0th-order phase value is set. A phase correction is performed using this value, and a frequency spectrum corresponding to each time τ is obtained.

If baseline corrections are performed using the value of a variable calculated for the baseline, a frequency spectrum that can be regarded as "powder pattern×gauss pattern" can be obtained, excluding a case in which a specific dipole-dipole interaction exists.

However, since the baseline term uses many variables, errors are easily produced as a result of the influence of noise. Additionally, since the offset amount of the baseline is proportional to the entire signal strength, no change will be noticed in an analytical result of a longitudinal relaxation curve even if baseline corrections are not made.

Therefore, if the error becomes big, it is permissible to proceed to the next process step without performing a baseline correction. If a sample has difficulty in finding a specific baseline pattern, a baseline correction cannot be performed, but, in the same way as above, there is no need to perform a baseline correction.

There is a case where a frequency spectrum in which the phase or the like has been corrected still includes a nonnegligible noise. In this case, a suitable digital smoothing filter is used for the frequency spectrum so as to remove the noise. An FFT filter, a Savitzky-Golay filter, or a moving average filter can be mentioned as the digital smoothing filter that can be used here. If the FFT filter is used here, that is equivalent to having applied a smoothing process to a time-domain spectrum (FID signal). The smoothing process may be performed when the time-base spectrum is obtained.

Figures 5A, 5B:
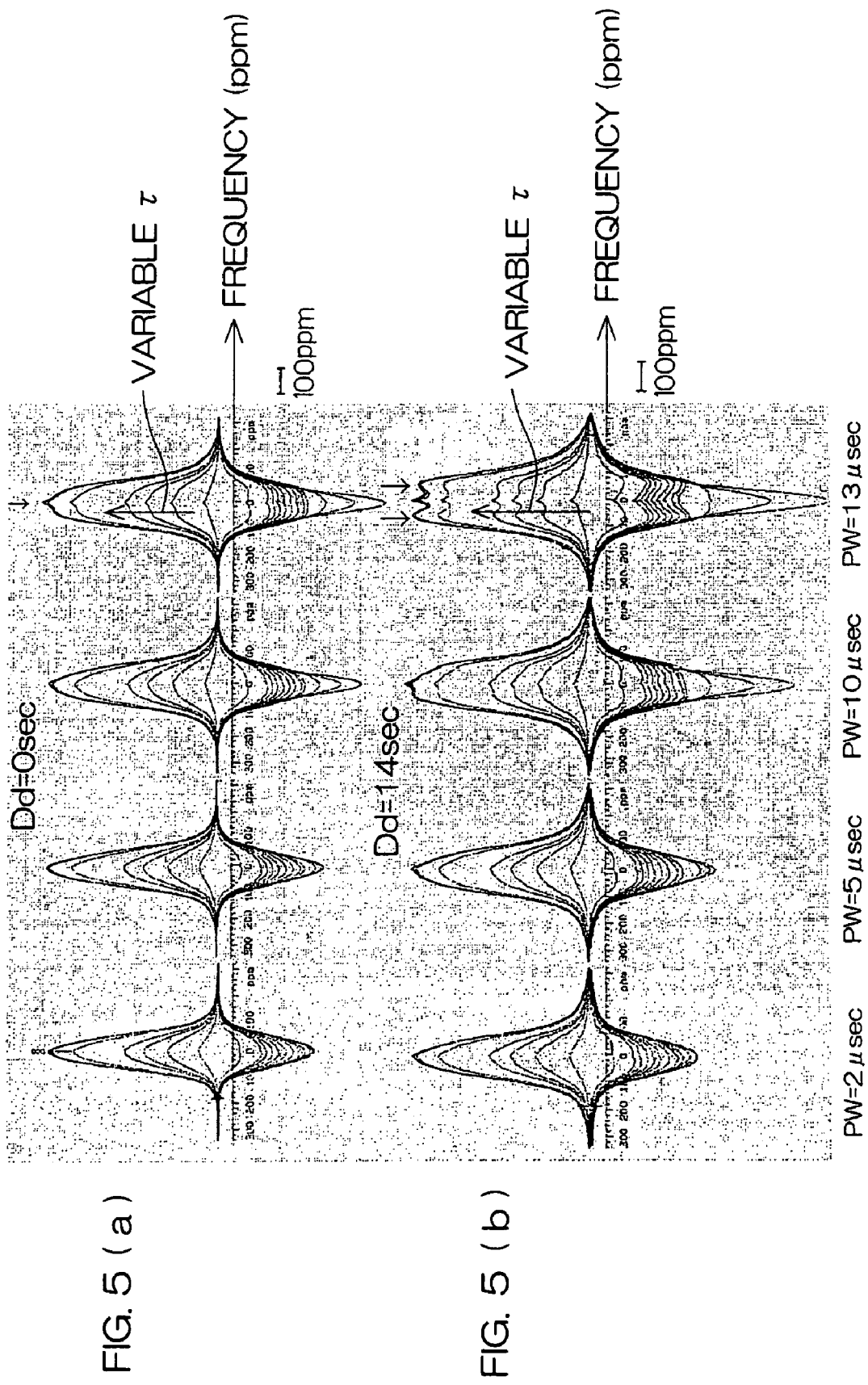
FIG. 5($a$) shows the frequency spectrum waveform of a receiver FID signal when the reception delay time Dd is 0, and FIG. 5($b$) shows the frequency spectrum waveform of a receiver FID signal when the reception delay time Dd is 14 μsec.

Examples of the frequency spectrum waveform of an obtained receiver FID signal are shown in FIG. 5(a) and FIG. 5(b). FIG. 5(a) and FIG. 5(b) are graphs showing a comparison between the frequency spectrum waveform appearing when the reception delay time Dd is 0 and the frequency spectrum waveform appearing when the reception delay time Dd is set at 14 microseconds in the frequency spectrum waveform of an IR-NMR receiver FID signal. The ordinate axis shows the spectrum strength, whereas the abscissa axis shows the relative frequency (unit: ppm) on the basis of the signal peak (4.5 ppm) of a water proton.

Four waveforms of FIG. 5(a) are frequency spectrum waveforms appearing when the reception delay time Dd is 0.

Four waveforms of FIG. 5(b) are frequency spectrum waveforms appearing when the reception delay time Dd is 14 microseconds.

In FIG. 5(a) and FIG. 5(b), the leftmost waveforms appear when the pulse width PW of a 90-degree pulse signal is 2 microseconds, the second waveforms from the left appear when the pulse width PW of a 90-degree pulse signal is 5 microseconds, the third waveforms from the left appear when the pulse width PW of a 90-degree pulse signal is 10 microseconds, and the rightmost waveforms appear when the pulse width PW of a 90-degree pulse signal is 13 microseconds.

Since the pulse width PW being 13 microseconds most properly functions as a pulse signal by which a proton spin is rotated by 90 degrees, a description will be hereinafter given by paying attention to the rightmost waveforms of FIGS. 5(a) and 5(b).

A plurality of waveforms are drawn as the rightmost waveforms of FIGS. 5(a) and 5(b). These are different from each other in the time τ from the end of the application of a 180-degree pulse signal to the start of the application of a 90-degree pulse signal. In this graph, time τ has a few tens of time stages ranging from substantially zero seconds to 70 seconds.

In FIG. 5(a), at anytime point of time τ, spectrum waveforms other than unnecessary protons, such as that of water, do not appear prominently. In other words, most thereof are signals of the water proton near 0 ppm. However, in FIG. 5(b), spectrum waveforms having the peak in frequencies other than the water proton appear on either side of the NMR spectrum of the water proton.

Concerning these spectra having the peaks at the left or right side, respectively, of the NMR spectrum of the water proton, time τ is set on the abscissa axis, and spectrum strength is plotted on the ordinate axis, thus creating a longitudinal relaxation curve. The longitudinal relaxation curve of the selected proton is sometimes called a "selected longitudinal relaxation curve."

The selected longitudinal relaxation curve is a curve having an inclination differing from that of the longitudinal relaxation curve of the water proton, and hence is distinguishable from the longitudinal relaxation curve of the water proton.

A plurality of kinds of protons contained in a solid sample can be quantified by recording the selected longitudinal relaxation curve and making a regression analysis.

This method is carried out on the supposition that (1) a measured individual sample is a mixture comprising a plurality of component substances differing in crystal form, and that (2) the proton of each component substance has different longitudinal relaxation time T1.

On the supposition that the selected longitudinal relaxation curve is formed of the linear sum of a plurality of longitudinal relaxation curves differing in longitudinal relaxation time T1, fitting is performed using the regression curve, thus making it possible to automatically obtain the value and the structural ratio of T1 of the longitudinal relaxation curves forming the selected longitudinal relaxation curve.

The regression analysis technique of the present invention will be hereinafter described in more detail.

At the specific frequency of an obtained frequency spectrum, the signal strength corresponding to variable waiting time ($\tau$) is plotted, so that the selected longitudinal relaxation curve mentioned above is obtained.

Preferably, not a frequency near about 0 ppm, as described above, but a frequency whose strength is maintained to some degree and that is small in the influence of the signal of water or other noises is used as the "specific frequency."

Additionally, it is permissible to use a signal-strength integral value falling within a specific frequency range, instead of the signal strength in a specific frequency. In this case, likewise, a smoothing process can be regarded as having been performed here.

The abundance ratio of constituents is determined by making a regression analysis on the supposition that a selected longitudinal relaxation curve obtained herein is the sum of the constituents having their respective values of T1. The mathematical formula used therefor is as follows:

$$\sum_{i=1}^{n} f_i \left(1 - H_{0_i} e^{-\frac{\tau}{T_{1i}}}\right) \qquad \text{[Formula 1]}$$

where T1 is longitudinal relaxation time, $-H_0$ is initial strength immediately after the application of a 180-degree pulse, f is a coefficient (i.e., a signal strength ratio which is equal to the abundance ratio of constituents), i is a suffix showing each constituent, and n is the total number of constituents.

Ideally, $H_0$ is 2 herein. However, in practice, $H_0$ is slightly smaller than 2 because of, for example, the inaccuracy of a 180-degree pulse. Although a crucial problem does not occur even if the analysis is made in this state, much time is consumed for the convergence in the least squares method. Therefore, the equation $f'=fH_0/2$ is formulated, and is then transformed, thus obtaining the following formula.

$$\sum_{i=1}^{n} f_i' \left(1 - 2e^{-\frac{\tau}{T_{1i}}}\right) + \sum_{i=1}^{n} f_i' \left(\frac{2}{H_{0_i}} - 1\right) \qquad \text{[Formula 2]}$$

Herein, the second term is a constant term not depending on time $\tau$, and hence a calculation can be performed by setting this term at a constant C.

Figure 6:
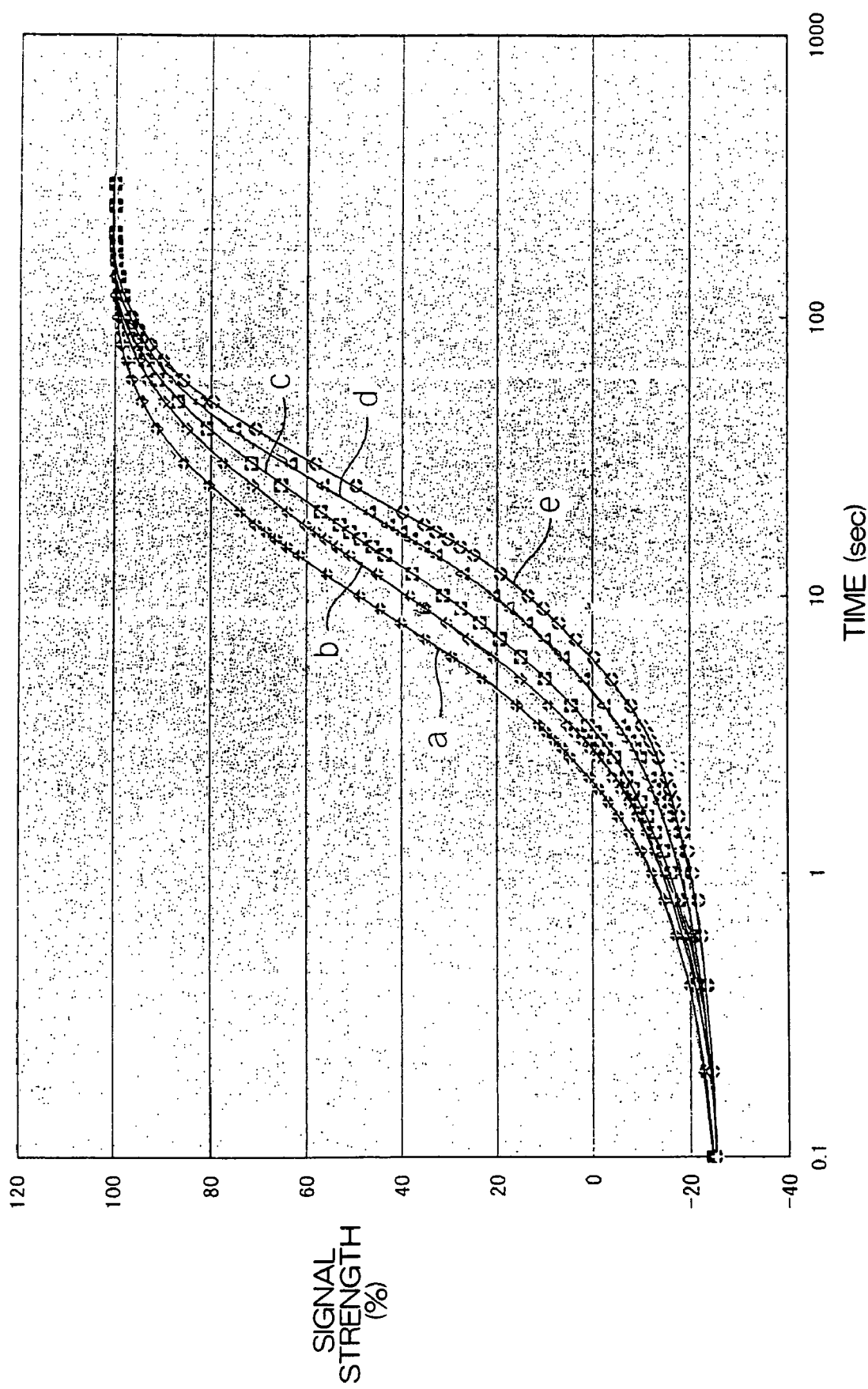
FIG. 6 is graphs of longitudinal relaxation time showing a crystal-polymorphic analysis of an arginine powder.
Figure 7:
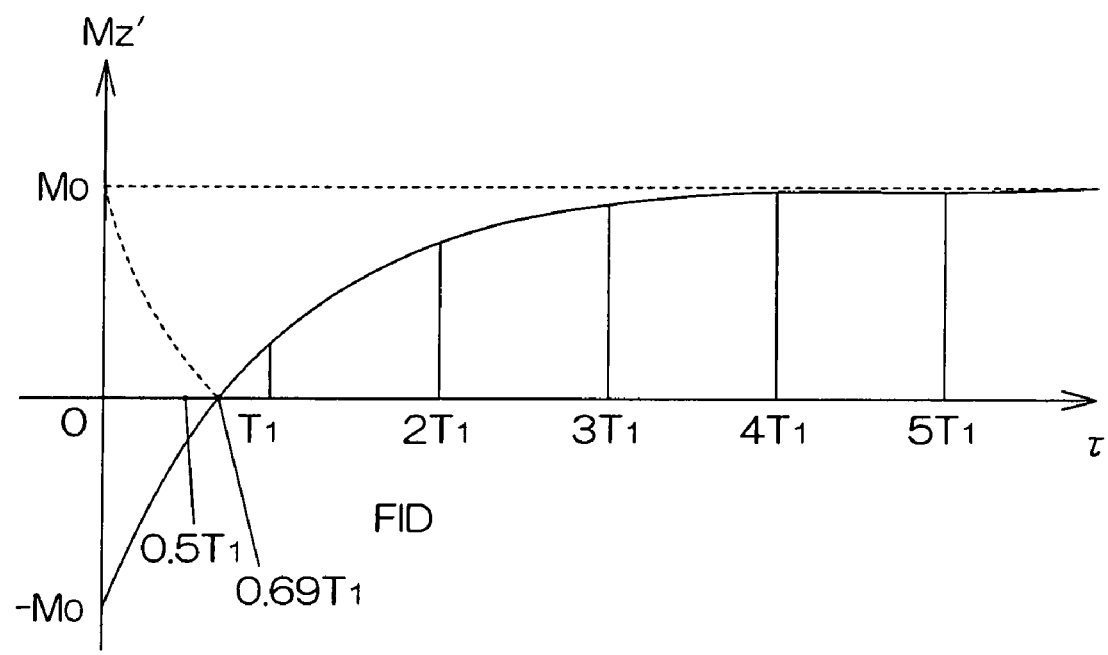
FIG. 7 is a graph showing a longitudinal relaxation curve that results from a single proton.

Additionally, since it is proper for the x-axis showing time $\tau$ to use a logarithmic representation as shown in FIG. 6, the equation s=ln$\tau$ is formulated and transformed. As a result, the following formula is obtained.

$$\sum_{i=1}^{n} f_i' (1 - 2e^{-e^{(s-S_i)}}) + C \qquad \text{[Formula 3]}$$

where Si is a logarithmic value of longitudinal relaxation time T1i.

Si=lnT1i

Using this formula, optimization is performed according to the least squares method, and the longitudinal relaxation time of each constituent and the coefficient thereof are calculated. The proper coefficient f and the proper value of $H_0$ can be calculated from f' and C. In most practical cases, the value of $H_0$ has little difference in each constituent, and hence substitution can be performed between f' and f.

If the constituents are significantly different from each other in longitudinal relaxation time T1, and are sufficient in their respective amounts, the value of T1 and the abundance ratio of each constituent can be obtained with a certain degree of accuracy even if a calculation is performed with respect to only one sample.

However, if the constituents are similar to each other in longitudinal relaxation time T1, or if specific constituents of a sample to be measured are extremely small in amount, the error will become big. To avoid this, an analysis is performed according to the nonlinear least-squares method with respect to a plurality of samples containing common constituents. This makes it possible to enhance the accuracy of the value of T1 of each constituent and to measure the abundance ratio thereof with high accuracy.

EXAMPLES

Example 1

According to the IR-NMR method of the present invention, the quantitative capability of an amorphous substance mixed with an arginine powder was evaluated.

This was measured by an INOVA 300 NMR measuring apparatus manufactured by Varian, Inc. Arginine was used as a sample.

FIG. 6 is graphs of longitudinal relaxation time showing a crystal-polymorphic analysis of the arginine powder. The ordinate axis shows signal strength, and the abscissa axis shows time $\tau$ (logarithm) ranging from the end of the application of a 180-degree pulse to the start of the application of a 90-degree pulse. Reference character a represents a pulverized product obtained by pulverizing an anhydrous arginine raw powder by use of an agate mortar, reference character b represents a sample in which the pulverized product is added to an arginine raw powder by 70%, reference character c represents a sample in which the pulverized product is added to the arginine raw powder by 50%, reference character d represents a sample in which the pulverized product is added to the arginine raw powder by 20%, and reference character e represents the arginine raw powder.

The graphs are based on the sum of FID signals of the constituents differing in relaxation time.

Three kinds of powders, i.e., arginine crystals, arginine amorphous substances, and aggregates are contained in these powdery samples. Let the longitudinal relaxation time T1 of the arginine crystal be represented as T1a, let the longitudinal relaxation time T1 of the arginine amorphous substance be represented as T1b, and let the longitudinal relaxation time T1 of the aggregate be represented as T1c. The signal strength Gtotal can be expressed as follows.

$$Gtotal = a1GA + b1GB + c1GC$$
$$= fa\{1 - 2\exp(-\tau/T1a)\} +$$
$$fb\{1 - 2\exp(-\tau/T1b)\} +$$
$$fc\{1 - 2\exp(-\tau/T1c)\}$$

In this equation, fa, fb, and fc represent ratios between the constituents.

If the measurement of a plurality of τ is performed, a plurality of equations each of which is the one mentioned above can be obtained. Since simultaneous equations in which T1a, T1b, T1c, fa, fb, and fc are unknown can be formulated, T1a, T1b, T1c, fa, fb, and fc can be determined by solving the equations. A statistical method, such as the non-linear least-squares method or the maximum likelihood estimation method, can be used in proportion to an increase in the number of measurement points, and hence, of course, the accuracy is improved.

Based on the graphs of FIG. 6, the simultaneous equations were solved by employing the statistical analysis. As a result, the following values were obtained.

T1a=28.02 seconds
T1b=12.01 seconds
T1c=3.99 seconds

In the pulverized product obtained by pulverizing an anhydrous arginine raw powder by use of an agate mortar, the constituent ratio was as follows.

fa=17.80%,
fb=64.46%,
fc=17.73%

In the sample in which the pulverized product is added to an arginine raw powder by 70%, the constituent ratio was as follows.

fa=41.01%,
fb=46.19%,
fc=12.80%

In the sample in which the pulverized product is added to the arginine raw powder by 50%, the constituent ratio was as follows.

fa=57.52%,
fb=32.42%,
fc=10.06%

In the sample in which the pulverized product is added to the arginine raw powder by 20%, the constituent ratio was as follows.

fa=79.94%,
fb=15.82%,
fc=10.06%

In the arginine raw powder, the constituent ratio was as follows.

fa=97.10%,
fb=2.55%,
fc=0.35%

As described above, according to the solid-sample nuclear magnetic resonance measuring method of the present invention, the process step of decomposition into a plurality of curves and the process step of fitting are applied onto a plurality of kinds of mixtures that are the same in chemical-compound composition but are different in crystal form. As a result, the longitudinal relaxation time and the constituent ratio of a selected proton, by which a signal deriving from each crystal form is given, can be obtained, respectively.

Example 2

(1) Preparation of Samples for Measurement

Indomethacin was used as a sample. A biochemical reagent of Wako Pure Chemical Industries, Ltd. was purchased as indomethacin. Based on this, samples were prepared according to seven methods mentioned below.

Sample 1 (MeCN Recrystallization; MeCN)

While being heated, 2 grams of indomethacin was dissolved in MeCN (acetonitrile) (50 ml). Undissolved crystals were filtered and removed, and filtrate was left at rest at room temperature. After a day, precipitated crystals were filtered off, and washing was performed with MeCN. Thereafter, drying was performed under reduced pressure.

Sample 2 (Et2O Recrystallization; Et2O)

While being slightly heated, 1 gram of indomethacin was dissolved in Et2O (diethyl ether) (50 ml). Undissolved crystals were filtered and removed, and filtrate was left at rest at room temperature. After three days, precipitated crystals were filtered off, and washing was performed with Et2O. Thereafter, drying was performed under reduced pressure.

Sample 3 (EtOH-water, no Recrystallization Aging; 0 h)

While being slightly heated, 2 grams of indomethacin was dissolved in EtOH (ethanol) (50 ml). Water was gradually added to this solution while being stirred. Water stopped being added when crystals started being precipitated. At once, a large amount of crystals were precipitated, and the system reached a state of being unable to be stirred. At once, precipitated crystals were filtered, and washing was performed with 50% EtOH. Thereafter, drying was performed under reduced pressure.

Sample 4 (EtOH-Water, 18-Hour Recrystallization Aging; 18 h)

In the same way as in sample 3, crystals were precipitated. The solution being in an unable-to-be-stirred state was continuously stirred with a magnetic stirrer without being stopped. Although this was in an unable-to-be-stirred state at the beginning, this was gradually changed into an able-to-be-stirred state. This was stirred for 18 hours at room temperature. Thereafter, crystals were filtered, and washing was performed with 50% EtOH. Thereafter, drying was performed under reduced pressure.

Sample 5 (0M)

Part of the crystals obtained in sample 3 was pulverized with an agate mortar, and a pulverized product was obtained.

Sample 6 (18M)

Part of the crystals obtained in sample 4 was pulverized with an agate mortar, and a pulverized product was obtained.

Sample 7 (R)

The purchased reagent was used in unchanged form.

(2) Measurement

These seven samples were put into a 5 mmΦ NMR tube so that the height becomes about 25 to 35 mm, and then put into a vacuum desiccator with Diphosphorus pentaoxide (P2O5) used as a dehydrating agent for one or more hours, and drying was performed. These were taken out from the desiccator immediately before measurement, and were immediately stoppered tightly. These were used as samples for measurement.

The measurement was performed by using the Bruker DPX-300 spectrometer/5 mmΦCH dual probe/SADC+A/D converter/XWIN-NMR software.

A shim was adjusted by using another NMR tube into which CDC13 was put up to the same height as the sample, and then the target sample was set in the probe. The measurement was performed in the state of "SWEEP OFF," "SPIN OFF," and "LOCK OFF." The sample temperature was adjusted at 23° C. by use of a temperature controller. The pulse program t1ir provided as a standard from Bruker Company was used, and measurement was performed with the following parameter values. As a result, a time-base spectrum (FID signal) was obtained.

D1 (Relaxation delay): 90 sec
P1 pw (90° pulse): 8.45 μs
P2=pl (180° pulse): 16.9 μs
DE=Dd (reception delay time): 16 μs
DE1 (delay time ranging from the closing of the transmitter coil to the opening of the receiver coil): 3 μs
O1 (observation center frequency): 2.54 ppm
NS (number of integrating operations): 8
DS (dummy scan): 2
SW (observation width): 497.314 ppm
DigMod (digitizer mode): Analog
ParMod (parameter mode): 2D
SI (data size): [F2] 16384, [F1] 64 (F1 and F2 are observation axes in the two-dimensional NMR)
TD (uptake data size): [F2] 16384, [F1] 45

A Fourier transform (xf2) was applied to the time-base spectrum obtained as above with the following parameter values. As a result, a frequency spectrum was obtained for each period of time τ.

WDW (window function): EM
LB (Line Broadening Factor): 300 Hz
PhC0: −99.56 (value in which the strengths of both ends of a spectrum are substantially the same: variable value depending on each measurement)
PhC1: 130 (value analogous to a spectrum measured in the digital digitizer mode: constant value)

Since this spectrum is a two-dimensional NMR spectrum interrelating with spectra corresponding to periods of waiting time (τ), the "split2D" was executed, and the real part and the imaginary part of one-dimensional spectra corresponding to the periods of waiting time (τ) were obtained. Data concerning these one-dimensional spectra were copied from a measuring computer to a data processing computer.

(3) Data Processing

The real part ($r_0$) and the imaginary part ($i_0$) of the one-dimensional spectrum copied to the data processing computer are shown by arranging Y-axis values from the low-wavenumber side toward the high-wavenumber side. Although values on the X axis (frequency axis) range from 251.17 ppm to −246.124 ppm, there is no need to make a calculation using especially the unit of ppm. Therefore, integers x (ranging from 1 to 16384) were substituted therefor.

The real part (r) of a frequency spectrum adjusted by a correct 0th-order phase value is expressed as follows:

$$r = r_0 \cos(PhC0) - i_0 \sin(PhC0)$$

where PhC0 is a 0th-order phase value to be corrected from the current state.

On the other hand, a baseline of a sin curve resulting from the inaccuracy of signal strength appearing immediately after the start of the uptake was used as the baseline. In this case, in relation to x, the baseline (basl) is expressed as follows.

$$basl = A + B \sin(Cx+D)$$

The coefficients PhC0, A, B, C, and D were calculated according to the nonlinear least-squares method so that the r and the basl coincide with each other in the extent where the X-axis values range from 1 to 2048 and in the extent where the X-axis values range from 14336 to 16384. Under the condition that r=basl, the following equation can be formulated.

$$r_0 \cos(PhC0) - i_0 \sin(PhC0) = A + B \sin(Cx+D)$$

However, since calculations cannot be performed in this state, the equation was transformed as follows:

$$r_0 = \{r_0 \sin(PhC0) + A + B \sin(Cx+D)\}/\cos(PhC0)$$

where $r_0$ is a dependent variable, and $i_0$ and x are independent variables.

Calculation results of sample 1 (MeCN recrystallization) are shown below.

TABLE 1A

| A | B | C | D | PhC0 | PhC0 (corrected) |
|---|---|---|---|------|------------------|
| −18560088.34 | −35371960.82 | 0.530416 | 8164.089 | −2.53131 | −2.6 |
| −18641245.5 | −35084197.73 | 0.548123 | 8164.511 | −2.45099 | −2.475 |
| −18880570.91 | −34750676.41 | 0.529324 | 8136.935 | −1.91209 | −2.35 |
| −19188701.9 | −34621817.61 | 0.520866 | 8161.021 | −2.54596 | −2.225 |
| −18995107.28 | −34549265.62 | 0.514546 | 8160.592 | −2.71764 | −2.1 |
| −19006363.07 | −34423089.96 | 0.523416 | 8150.432 | −1.99075 | −1.975 |
| −19172530.65 | −33916071.82 | 0.526752 | 8141.717 | −2.09543 | −1.85 |
| −18973751.48 | −34014594.16 | 0.527977 | 8148.807 | −1.77497 | −1.725 |
| −18813541.07 | −33853800.51 | 0.518876 | 8148.219 | −1.28569 | −1.6 |
| −18475271.09 | −33889180.77 | 0.526671 | 8156.595 | −1.46661 | −1.475 |
| −18661080.21 | −33385697.97 | 0.519225 | 8132.685 | −1.09835 | −1.38 |
| −18329245.09 | −33258451.88 | 0.519425 | 8152.947 | −0.922477 | −1.285 |
| −18171542.97 | −32592696.84 | 0.527473 | 8165.525 | −1.36935 | −1.19 |
| −17898423.23 | −32232619.94 | 0.500092 | 8178.881 | −1.81755 | −1.095 |
| −17778341.99 | −31700091.17 | 0.524117 | 8148.15 | −0.657729 | −1 |
| −17362809.5 | −31264583.21 | 0.529787 | 8167.705 | −1.29616 | −0.905 |
| −17073689.39 | 30468116.46 | 0.533883 | 8174.173 | −1.36431 | −0.81 |
| −16883124.64 | −29690471.43 | 0.527328 | 8164.502 | −0.335533 | −0.715 |
| −16322519.58 | −29085342.8 | 0.50976 | 8176.524 | −0.852706 | −0.62 |
| −15921714.35 | −28259108.35 | 0.517755 | 8172.68 | −0.20242 | −0.525 |
| −15039798.62 | −27016303.73 | 0.525881 | 8177.689 | −0.537248 | −0.43 |

TABLE 1B

| A | B | C | D | PhC0 | PhC0 (corrected) |
|---|---|---|---|---|---|
| −14038237.56 | −25333734.36 | 0.51251 | 8196.356 | −0.774681 | −0.335 |
| −12874742.1 | −23324000.45 | 0.502681 | 8174.393 | 0.201961 | −0.24 |
| −11578879.81 | −20837380 | 0.483257 | 8193.796 | 0.0757171 | −0.145 |
| −10312676.49 | −18450827.93 | 0.504593 | 8209.986 | −0.477082 | −0.05 |
| −8961944.001 | −16532052.95 | 0.493431 | 8183.218 | 0.534294 | 0.045 |
| −7342144.464 | −13461109.88 | 0.509912 | 8233.159 | −1.36166 | 0.14 |
| −5848768.123 | −10527056.88 | 0.506645 | 8195.595 | 0.731044 | 0.235 |
| −3842273.808 | −7177118.849 | 0.484079 | 8267.187 | −1.67545 | 0.33 |
| −2224252.287 | −3774084.28 | 0.48088 | 8265.813 | 0.736975 | 0.425 |
| 276076.62 | −469574.79 | 0.496588 | 8540.988 | 5.96791 | 0.52 |
| 2536056.32 | 4267782.632 | 0.527585 | 8190.665 | 1.10551 | 0.59 |
| 5100157.192 | 8696889.756 | 0.528072 | 8265.608 | −1.41766 | 0.66 |
| 7626494.571 | 13138814.58 | 0.501366 | 8140.71 | 3.00361 | 0.73 |
| 10207851.23 | 17406297.9 | 0.520495 | 8187.727 | 1.37506 | 0.8 |
| 12755338.8 | 22248723.49 | 0.513167 | 8213.313 | −0.560938 | 0.87 |
| 15217272.14 | 26496594.42 | 0.501938 | 8170.271 | 1.46622 | 0.94 |
| 17509796.55 | 30915702.06 | 0.524265 | 8165.398 | 0.978927 | 1.01 |
| 19843967.81 | 34968657.81 | 0.516925 | 8139.288 | 1.17099 | 1.08 |
| 21569809.08 | 38350446.16 | 0.528953 | 8146.715 | 0.920894 | 1.15 |
| 23629600.85 | 41782617.37 | 0.514997 | 8126.39 | 1.53121 | 1.22 |
| 25851219.25 | 46057622.54 | 0.534418 | 8128.976 | 1.29237 | 1.29 |
| 26746444.55 | 48138237.01 | 0.524036 | 8102.483 | 1.28472 | 1.36 |
| 27052469.48 | 48726429.24 | 0.548169 | 8123.783 | 1.21352 | 1.43 |
| 27122712.85 | 48877451.18 | 0.546263 | 8120.23 | 1.49238 | 1.5 |

The tables show that the value of PhC0 is gradually and continuously changed in accordance with the measuring order, but is fluctuated by the influence of noise. Especially near the point at which the signal strength becomes weak, a great variation occurs therein.

The value of PhC0 (corrected) was produced by being corrected from the overall changes of PhC0 so that the value of PhC0 can be continuously changed. A 0th-order phase-adjusted frequency spectrum was obtained by using the value of PhC0 (corrected).

The 191-point FFT smoothing filter was applied to the obtained frequency spectrum so as to remove noise.

The signal strength in which the X-axis value of the frequency spectrum is 7000 (corresponding to 38.72 ppm in terms of frequency) was plotted with respect to each period of waiting time ($\tau$), thus obtaining longitudinal relaxation curves.

Likewise, concerning the indomethacin samples of sample 2 to sample 7, longitudinal relaxation curves were produced. These results are shown in Table 2A and Table 2B.

TABLE 2A

| $\tau$ | ln $\tau$ | MeCN | Et2O | 0 h | 18 h | 0 M | 16 M | R |
|---|---|---|---|---|---|---|---|---|
| 0.00005 | −9.903 | −291161455.2 | −155516616.4 | −195626262 | −197872856 | −253287019 | −260896939.1 | −227236771.5 |
| 0.0001 | −9.210 | −267450816.6 | −154641382.2 | −194018101.7 | −195819671.1 | −249922140.7 | −258510835.8 | −226522843.2 |
| 0.0002 | −8.517 | −281344377.5 | −152430772.4 | −190327626.7 | −191871823.6 | −245044259.8 | −253527089.5 | −223046648.4 |
| 0.0005 | −7.601 | −274429701 | −149344415.7 | −186522810.9 | −187465980.7 | −238631963.6 | −247233776.9 | −217825802.4 |
| 0.001 | −6.908 | −269713709.6 | −147473701 | −182854460.9 | −184954231.7 | −234809477.6 | −242991257.7 | −213448261.4 |
| 0.002 | −6.215 | −266507526.4 | −146414134.7 | −181081775.2 | −182927323.3 | −231304494 | −241168447.4 | −211060199.8 |
| 0.005 | −5.298 | −263771028.2 | −145861644.9 | −179468919.1 | −181353321.9 | −229018806.6 | −238154167.7 | −209590173.4 |
| 0.01 | −4.605 | −261952033.9 | −145839820.3 | −178328612.1 | −180122264.9 | −227038461.3 | −236566551.9 | −208769297.1 |
| 0.02 | −3.912 | −261004660 | −145054946.7 | −176664126.1 | −178937828.9 | −225065022.9 | −235220506.1 | −207285451 |
| 0.033 | −3.411 | −259380936.4 | −144372033.5 | −174632980.2 | −177309080.7 | −222589287.8 | −232909951.8 | −205286416.1 |
| 0.05 | −2.996 | −258089742.7 | −143027430.8 | −173070686 | −175611920.7 | −220082327.4 | −229919496.4 | −203493156 |
| 0.07 | −2.659 | −255915904.8 | −141302210 | −170306960.8 | −173160692.7 | −216547292.6 | −227243395.8 | −201030182.6 |
| 0.1 | −2.303 | −252558368.2 | −139075136.2 | −165678870.2 | −169694150.5 | −211476905.8 | −222864377.9 | −197455248.7 |
| 0.13 | −2.040 | −249351362.2 | −136821459.8 | −162266995.6 | −166476118 | −206458602.5 | −218212747 | −193623291.2 |
| 0.16 | −1.833 | −245690207.6 | −134677841.7 | −158071337.4 | −163140396 | −201532962.8 | −213567422.9 | −190114080.3 |
| 0.2 | −1.609 | −241739614 | −131850496.7 | −153164145.9 | −159100213.6 | −195179877.9 | −207739278.5 | −185151463.6 |
| 0.24 | −1.427 | −237071074.6 | −129002182.6 | −147762183.9 | −154955205.7 | −188755545 | −202053699.8 | −180517429.7 |
| 0.28 | −1.273 | −232479160.7 | −126590928.2 | −142693647.7 | −151347236.7 | −182312056.5 | −196885632.9 | −176390969.9 |
| 0.34 | −1.079 | −226530741.8 | −122506058.9 | −135326632.8 | −145093739.8 | −173840539.5 | −188217185.8 | −169198428.4 |
| 0.4 | −0.916 | −220496598.5 | −118318213.8 | −128261043.3 | −139201347.2 | −164900824.2 | −179953499 | −162400340.1 |
| 0.5 | −0.693 | −210038795.6 | −112314353.6 | −117415389.9 | −129808047.4 | −150893581.5 | −167167389.3 | −151662970.4 |
| 0.63 | −0.462 | −197490361.2 | −103905668.9 | −102809053.9 | −118038844 | −133448745.4 | −150662170.8 | −137809570.9 |
| 0.8 | −0.223 | −181076704.7 | −93574347.3 | −85997467.28 | −103701448.4 | −112192770.8 | −130714744.4 | −120549226.8 |

TABLE 2B

| $\tau$ | ln $\tau$ | MeCN | Et2O | 0 h | 18 h | 0 M | 16 M | R |
|---|---|---|---|---|---|---|---|---|
| 1 | 0.000 | −163052730.3 | −82572677.16 | −68018349.08 | −87338421.98 | −90101799.73 | −107868453.9 | −101871818.7 |
| 1.2 | 0.182 | −146219540.4 | −72259015.57 | −52296773.25 | −72415023.95 | −68645559.61 | −86731475.69 | −84142928.82 |

TABLE 2B-continued

| τ | ln τ | MeCN | Et2O | 0 h | 18 h | 0 M | 16 M | R |
|---|---|---|---|---|---|---|---|---|
| 1.4 | 0.336 | −130429744.4 | −62224626.16 | −37338173.13 | −57900768.95 | −49448173.08 | −67270102.91 | −67683849.77 |
| 1.7 | 0.531 | −107216940.4 | −48286871.13 | −15907679.53 | −38193115.42 | −23506193.25 | −39513814.99 | −44201153.32 |
| 2 | 0.693 | −85652044.03 | −35606036.24 | 3063811.899 | −19974413.04 | 360225.831 | −14994519.5 | −23443790.2 |
| 2.4 | 0.875 | −59429812.6 | −20289857.14 | 24722464.63 | 2028792.872 | 28223968.75 | 15309573.61 | 2534840.572 |
| 2.8 | 1.030 | −35810852.15 | −6298542.604 | 44790809.66 | 21815205.16 | 53141500.18 | 42211017.64 | 25703379.76 |
| 3.33 | 1.203 | −6425363.1 | 10429300.48 | 67838343.59 | 45665053.29 | 82470254.53 | 73846925.24 | 53192628.68 |
| 4 | 1.386 | 26608757.1 | 29171169.29 | 93103745.91 | 71460688.13 | 113614659 | 108586247.6 | 83381628.65 |
| 4.8 | 1.569 | 61599886.96 | 48709256.46 | 118750824.4 | 97456406.38 | 145168962 | 143681567.8 | 113753718 |
| 5.7 | 1.740 | 96060734 | 67663962.02 | 142544133.7 | 122015774.4 | 175138741.8 | 175977632.8 | 142612124.9 |
| 6.7 | 1.902 | 129556036.9 | 85920534.29 | 163673539.9 | 144815668.4 | 202542066.2 | 205149165.5 | 169928428.8 |
| 8 | 2.079 | 166279062.8 | 105272141.3 | 186941178.3 | 167881944.9 | 230768402.2 | 235242754.1 | 197704459.5 |
| 9.5 | 2.251 | 200840690.1 | 123732949.8 | 205921088.9 | 189114146.4 | 255301839.6 | 261665671.7 | 222220472.9 |
| 11.3 | 2.425 | 233806304.4 | 140973859 | 223687312.2 | 207331682.5 | 276458523.2 | 284786709.6 | 244120946.2 |
| 13.5 | 2.603 | 265810668.6 | 156745431 | 237976913.3 | 223014858.6 | 295293492.7 | 304287268.8 | 263313224.2 |
| 16 | 2.773 | 292649624.3 | 169730109.8 | 249699436.2 | 235171470.5 | 308643988.2 | 317704746.8 | 277421248.3 |
| 20 | 2.996 | 320948006 | 183470639.5 | 258523553.9 | 246804516.7 | 320189820.1 | 331193025.1 | 290666621.5 |
| 30 | 3.401 | 354678877.5 | 198647558 | 265509279.8 | 257194323.1 | 329499842.3 | 342453754 | 302530283.5 |
| 45 | 3.807 | 369516152.1 | 204765930.9 | 267931044 | 259765571.7 | 332316900.1 | 345165140.7 | 306124389.6 |
| 60 | 4.094 | 373706502.4 | 206096032.1 | 268745964 | 260430164.7 | 332546242.5 | 346389625.2 | 307457904.5 |
| 120 | 4.787 | 375306116.8 | 206846677.7 | 269562105.2 | 261225891.1 | 332984409.5 | 346825670.7 | 308183647.7 |

The longitudinal relaxation curves obtained as Table 2A and Table 2B concerning the seven samples were simultaneously analyzed using the following formula.

$$\sum_{i=1}^{n} f_i'\left(1 - 2e^{-e^{(s-S_i)}}\right) + C \quad \text{[Formula 4]}$$

Five kinds of constituents of indomethacin were found (in the formula, n=5).

The number n of constituents is determined as follows. First, the 95% confidence interval value of f' is calculated. If f' becomes equal to the 95% confidence interval value or smaller than this value, the constituents are regarded as being absent. For example, on the supposition that n=3, a comparison is made between f'1 and the 95% confidence interval value. If f'1 is greater than the 95% confidence interval value, the number n is set at 4 (i.e., n=4), and an examination is made as to whether f'1 and f'2 are all not less than the 95% confidence interval value. The number n is increased in this way. If f' that exceeds an arbitrary number n becomes less than the 95% confidence interval value, this number n is determined as the number of constituents.

Table 3 shows calculation results of the estimate value and the standard error of longitudinal relaxation time Si.

TABLE 3

| | Estimate value | Standard error |
|---|---|---|
| S1 | 2.31861 | 0.01127 |
| S2 | 1.54191 | 0.00919 |
| S3 | 0.07003 | 0.02001 |
| S4 | −6.45511 | 0.15242 |
| S5 | −8.30651 | 0.10355 |

Table 4 shows calculation results of the estimate value of coefficient fi and the estimate value of constant C.

TABLE 4

| | | MeCN | Et2O | 0 h | 0 M | 18 h | 18 M | R |
|---|---|---|---|---|---|---|---|---|
| | | (Estimate value) | | | | | | |
| | f1 | 179780327.2 | 76896003.52 | 26251437.18 | 35878665.4 | 30985235.14 | 27949499.18 | 43293165.94 |
| | f2 | 123090554.6 | 86185892.41 | 163043268.7 | 165659932.2 | 206245253.2 | 234562139.6 | 194629300.8 |
| | f3 | 16415415.52 | 13708383.41 | 35145641.6 | 19550687.94 | 43804157.19 | 29815837.74 | 21061569.02 |
| | f4 | 4957365.801 | 770598.7548 | 3530400.271 | 3167832.659 | 5473638.747 | 4162542.557 | 3612612.683 |
| | f5 | 10512716.65 | 4676184.602 | 5778023.155 | 6331640.672 | 8417305.268 | 8707999.039 | 6667933.353 |
| | C | 39738295.64 | 24610946.24 | 35708695.18 | 30340056.96 | 38601504.15 | 40693972.15 | 38463312.15 |

Table 5 shows calculation results of the standard error of coefficient fi and the standard error of constant C.

TABLE 5

| | | MeCN | Et2O | 0 h | 0 M | 18 h | 18 M | R |
|---|---|---|---|---|---|---|---|---|
| | | (Standard error) | | | | | | |
| | f1 | 3396240.259 | 1766837.846 | 1616393.409 | 1853087.805 | 1951895.348 | 2275001.116 | 2161095.975 |
| | f2 | 3617216.617 | 1824354.276 | 1381613.701 | 1546611.552 | 1584035.399 | 1696369.317 | 1767513.852 |
| | f3 | 610013.7184 | 499394.1109 | 921068.9017 | 709505.9899 | 1125612.37 | 987598.7324 | 780540.9843 |

TABLE 5-continued (Standard error)

|  | MeCN | Et2O | 0 h | 0 M | 18 h | 18 M | R |
|---|---|---|---|---|---|---|---|
| f4 | 793692.4788 | 405463.8619 | 568153.8707 | 561671.1539 | 765325.3398 | 687375.1105 | 597531.356 |
| f5 | 780119.4702 | 519730.4369 | 650040.1152 | 630634.2432 | 807067.8342 | 708909.8659 | 660851.0164 |
| C | 367194.3623 | 315202.8009 | 312050.4795 | 317748.4315 | 329143.037 | 338506.3065 | 319756.7396 |

From these results, values of the longitudinal relaxation time T1 of the indomethacin constituents were determined as 10.16 s (assigned to γ type), 4.67 s (assigned to α type), 1.07 s (assigned to amorphous), 1.57 ms (assignment unknown), and 0.25 ms (assignment unknown).

Additionally, the constituent ratio of each sample was determined as in Table 6, using the strength coefficient fi. Additionally, the ±95% confidence interval was calculated at the same time.

TABLE 6

| T1 | MeCN | Et2O | 0 h | 0 M | 18 h | 18 M | R |
|---|---|---|---|---|---|---|---|
| 10.16 s | 53.70 ± 2.00% | 42.20 ± 1.91% | 11.23 ± 1.36% | 10.51 ± 1.30% | 15.56 ± 1.58% | 9.16 ± 1.47% | 16.08 ± 1.58% |
| 4.67 s | 36.77 ± 2.13% | 47.29 ± 1.97% | 69.75 ± 1.16% | 69.93 ± 1.06% | 71.84 ± 1.32% | 76.86 ± 1.10% | 72.28 ± 1.29% |
| 1.07 s | 4.90 ± 0.36% | 7.52 ± 0.54% | 15.04 ± 0.78% | 14.85 ± 0.75% | 8.48 ± 0.61% | 9.77 ± 0.64% | 7.82 ± 0.57% |
| 1.57 ms | 1.48 ± 0.47% | 0.42 ± 0.44% | 1.51 ± 0.48% | 1.86 ± 0.51% | 1.37 ± 0.48% | 1.36 ± 0.44% | 1.34 ± 0.44% |
| 0.25 ms | 3.14 ± 0.46% | 2.57 ± 0.56% | 2.47 ± 0.55% | 2.85 ± 0.54% | 2.75 ± 0.54% | 2.85 ± 0.46% | 2.48 ± 0.48% |

(Estimate value ±95% confidence interval)

In this way, the constituent ratio of the solid crystal polymorphs of indomethacin was able to be determined with high accuracy. The longitudinal relaxation time of each constituent, as well as the constituent ratio, was able to be measured at the same time.

Example 3

(1) Preparation of Samples for Measurement

Glycine was used as a sample. Special grade Reagent chemicals of Wako Pure Chemical Industries, Ltd. were used as glycine. Based on this, samples were prepared according to eight methods mentioned below.

Sample 1 (Water Recrystallization; A)

While being slightly heated, 10 grams of glycine was dissolved in water (40 ml). The solution was left at rest at room temperature. After three days, precipitated crystals were filtered off, and washing was performed with water. Thereafter, drying was performed under reduced pressure.

Sample 2 (Water-acetic Acid Recrystallization; C)

While being heated, 15 grams of glycine was dissolved in water (30 ml)-acetic acid (3 ml). The solution was gradually cooled down to room temperature, and precipitated crystals were filtered off. Washing was performed with water, and then drying was performed under reduced pressure.

Sample 3 (Water-EtOH Recrystallization; B)

While being slightly heated, 10 grams of glycine was dissolved in water (40 ml). EtOH (20 ml) was gradually added while stirring the solution at room temperature. Precipitated crystals were filtered off. Thereafter, washing was performed with water, and drying was performed under reduced pressure.

Sample 4 (Water-EtOH Recrystallization 60-Degree Drying; B60)

Crystals obtained in the same way as in sample 3 were subjected to hot-air drying at 60° C. for 16 hours.

Sample 5 (S)

Crystals that had adhered to the device wall when the recrystallization operation of sample 1 as performed were taken out. Thereafter, washing was performed with water, and drying was performed under reduced pressure.

Sample 6 (CM)

Part of the crystals obtained in sample 2 was pulverized with an agate mortar, and a pulverized product was obtained.

Sample 7 (RM)

The purchased reagent was pulverized with an agate mortar, and a pulverized product was obtained.

Sample 8 (R)

The purchased reagent was used in unchanged form.

(2) Measurement

These eight samples were put into a 5 mmΦ NMR tube so that the height becomes about 25 to 35 mm, and then put into a vacuum desiccator with Diphosphorus pentaoxide (P2O5) used as a dehydrating agent for one or more hours, and drying was performed. These were taken out from the desiccator immediately before measurement, and were immediately stoppered tightly. These were used as samples for measurement.

The measurement was performed by using the Bruker DPX-300 spectrometer/5 mmΦCH dual probe/SADC+A/D converter/XWIN-NMR software.

A shim was adjusted by using another NMR tube into which CDC13 was put up to the same height as the sample, and then the target sample was set in the probe. The measurement was performed in the state of "SWEEP OFF," "SPIN OFF," and "LOCK OFF." The sample temperature was adjusted at 23° C. by use of a temperature controller. The pulse program t1ir provided as a standard from Bruker Company was used, and measurement was performed with the following parameter values. As a result, a time-base spectrum (FID signal) was obtained.

D1 (Relaxation delay): 60 s
P1=pw (90° pulse): 8.45 μs
P2=pl (180° pulse): 16.9 μs
DE=Dd (reception delay time): 16 μs
DE1 (delay time ranging from the closing of the transmitter coil to the opening of the receiver coil): 3 μs
O1 (observation center frequency): 2.54 ppm
NS (number of integrating operations): 8
DS (dummy scan): 2
SW (observation width): 497.314 ppm
DigMod (digitizer mode): Analog
ParMod (parameter mode): 2D
SI (data size): [F2] 16384, [F1] 64
TD (uptake data size): [F2] 16384, [F1] 45 (F1 and F2 are observation axes in the two-dimensional NMR)

A Fourier transform (xf2) was applied to the time-base spectrum obtained as above with the following parameter values. As a result, a frequency spectrum was obtained.
WDW (window function): EM
LB (Line Broadening Factor): 300 Hz
PhC0: −0.64 (value in which the strengths of both ends of a spectrum are substantially the same: variable value depending on each measurement)
PhC1: 130 (value analogous to a spectrum measured in the digital digitizer mode: constant value)

Since this spectrum is a two-dimensional NMR spectrum consisting of spectra corresponding to periods of waiting time (τ), the "split2D" was executed, and the real part and the imaginary part of one-dimensional spectra corresponding to the periods of waiting time (τ) were obtained. Data concerning these one-dimensional spectra were copied from a measuring computer to a data processing computer.

(3) Data Processing

A 0-order phase adjustment was performed by using the real part ($r_0$) and the imaginary part ($i_0$) of the one-dimensional spectrum copied to the data processing computer.

The real part (r) of a frequency spectrum adjusted by a correct 0th-order phase value is expressed as follows:

$$r = r_0 \cos(PhC0) - i_0 \sin(PhC0)$$

where PhC0 is a 0th-order phase value to be corrected from the current state.

On the other hand, the frequency spectrum (b) of glycine separately measured was used as the baseline.

The coefficients PhC0, A, and B were calculated according to the nonlinear least-squares method so that the r and the b coincide with each other in the extent where the X-axis values range from 1 to 2048 and in the extent where the X-axis values range from 14336 to 16384.

$$b = Ar + B = A\{r_0 \cos(PhC0) - i_0 \sin(PhC0)\} + B$$

Table 7A and Table 7B show calculation results of the glycine water-acetic acid recrystallization sample 2.

TABLE 7A

| A | B | PhC0 | PhC0 (corrected) |
|---|---|---|---|
| −2.71366 | 10466755.2 | −4.815 | −4.780 |
| −2.72912 | 9969258.9 | −4.673 | −4.480 |
| −2.80095 | 7456032.3 | −4.496 | −4.180 |
| −2.87614 | 5441200.7 | −4.172 | −3.880 |
| −2.98508 | 2191673.0 | −4.016 | −3.534 |
| −3.03827 | 803903.8 | −3.238 | −3.225 |
| −3.11561 | −1408193.9 | −2.688 | −2.949 |
| −3.15601 | −1883755.7 | −2.464 | −2.703 |
| −3.17825 | −2339447.3 | −2.697 | −2.483 |
| −3.19324 | −2180978.0 | −2.146 | −2.287 |

TABLE 7A-continued

| A | B | PhC0 | PhC0 (corrected) |
|---|---|---|---|
| −3.23511 | −2817219.1 | −1.776 | −2.110 |
| −3.25131 | −1754962.1 | −1.809 | −1.952 |
| −3.30726 | −2186721.5 | −2.134 | −1.808 |
| −3.35919 | −1976897.9 | −1.429 | −1.676 |
| −3.41139 | −1204228.2 | −1.226 | −1.555 |
| −3.49709 | −2023429.8 | −1.417 | −1.442 |
| −3.59266 | −1820384.4 | −1.532 | −1.336 |
| −3.69286 | −2324054.5 | −1.071 | −1.234 |
| −3.80597 | −2131118.4 | −1.073 | −1.136 |
| −3.97078 | −2014626.0 | −1.119 | −1.040 |
| −4.1509 | −1795387.1 | −1.515 | −0.945 |
| −4.47188 | −1814828.6 | −0.673 | −0.850 |
| −4.96056 | −1255988.6 | −1.020 | −0.756 |

TABLE 7B

| A | B | PhC0 | PhC0 (corrected) |
|---|---|---|---|
| −5.78791 | −548412.1 | −0.825 | −0.660 |
| −7.07361 | 851318.0 | −0.820 | −0.563 |
| −9.11182 | 783459.5 | −0.455 | −0.465 |
| −12.14651 | 4802717.1 | −1.636 | −0.366 |
| −25.18997 | 10916603.8 | −2.226 | −0.267 |
| 18.02675 | −164173140.9 | −99.492 | −0.167 |
| 19.58743 | 4407625.5 | 1.292 | −0.067 |
| 10.97926 | 8262259.0 | 0.535 | 0.030 |
| 7.07471 | 6862847.9 | −0.053 | 0.126 |
| 5.06505 | 6735688.7 | 0.411 | 0.217 |
| 3.88221 | 4725572.2 | 0.533 | 0.304 |
| 3.21722 | 4883904.6 | 0.936 | 0.383 |
| 2.78329 | 4453119.1 | 0.509 | 0.398 |
| 2.43906 | 4502630.6 | 0.338 | 0.413 |
| 2.20738 | 4323592.2 | 0.293 | 0.428 |
| 2.05995 | 4636996.2 | 0.599 | 0.443 |
| 1.95225 | 4327988.0 | 0.363 | 0.458 |
| 1.88431 | 4113055.3 | 0.468 | 0.473 |
| 1.82583 | 3925127.9 | 0.192 | 0.488 |
| 1.79565 | 4090824.7 | 0.540 | 0.503 |
| 1.78814 | 3602165.8 | 0.532 | 0.518 |
| 1.78814 | 3602165.8 | 0.532 | 0.533 |

In the same way as in Example 2, the value of PhC0 (corrected) was produced by being corrected from the overall changes of PhC0 so that the value of PhC0 can be continuously changed. A 0th-order phase-adjusted frequency spectrum was obtained by using the value of PhC0 (corrected).

The 191-point FFT smoothing filter was applied to the obtained frequency spectrum so as to remove noise.

The signal strength at 100 ppm of the frequency spectrum was plotted with respect to each period of waiting time (τ), thus obtaining longitudinal relaxation curves.

Likewise, concerning the glycine samples of sample 2 to sample 8, longitudinal relaxation curves were produced. These results are shown in Table 8A and Table 8B.

TABLE 8A

| τ | ln τ | R | C | B60 | A | B | RM | CM | S |
|---|---|---|---|---|---|---|---|---|---|
| 0.00002 | -10.820 | -223452548 | -113973815 | -153789978 | -178228228 | -104972358 | -246578959 | -164546450 | -110855890 |
| 0.00005 | -9.903 | -220764866 | -113476686 | -151189303 | -175615407 | -103741145 | -242355021 | -161421243 | -109523231 |
| 0.0001 | -9.210 | -213785822 | -109132248 | -145494391 | -169383364 | -99701346 | -232776894 | -152766279 | -104717316 |
| 0.0002 | -8.517 | -206448001 | -104967966 | -139986667 | -162604599 | -95728570 | -221446013 | -142620729 | -99474672 |
| 0.0005 | -7.601 | -197931402 | -100547130 | -132718041 | -154508428 | -90629466 | -208354032 | -130372616 | -93503897 |
| 0.001 | -6.908 | -192947884 | -97771606 | -127810845 | -149671180 | -87404230 | -200170698 | -123713038 | -89628243 |
| 0.002 | -6.215 | -188920979 | -96138064 | -125337122 | -146261195 | -84572235 | -192681354 | -119597919 | -86955690 |
| 0.005 | -5.298 | -182651499 | -95328310 | -120529317 | -140727445 | -81674622 | -185584661 | -118074556 | -83985207 |
| 0.01 | -4.605 | -174673464 | -95211875 | -114745977 | -133418665 | -78099599 | -176452360 | -117899243 | -80334886 |
| 0.02 | -3.912 | -158131955 | -94813293 | -103186001 | -119990862 | -70179900 | -158496672 | -116760044 | -73208619 |
| 0.0333 | -3.402 | -136479277 | -93473268 | -89190096 | -103695110 | -60599394 | -135735570 | -115512624 | -64177531 |
| 0.05 | -2.996 | -111986378 | -92169616 | -72896931 | -83322493 | -48943629 | -109199937 | -113990850 | -53830442 |
| 0.07 | -2.659 | -83616271 | -91498890 | -54326805 | -61888457 | -35699655 | -78834633 | -112100357 | -42725797 |
| 0.1 | -2.303 | -45441923 | -89472959 | -29221320 | -31021625 | -18620314 | -38067573 | -109369439 | -26322574 |
| 0.13 | -2.040 | -11826080 | -88230163 | -6321577 | -4047329 | -2567323 | -1216394 | -106367938 | -11728659 |
| 0.16 | -1.833 | 18851541 | -86408476 | 14623251 | 20256674 | 11387047 | 32533305 | -103347314 | 891708 |
| 0.2 | -1.609 | 55730441 | -84055360 | 38965151 | 49371738 | 28609791 | 71283995 | -100042017 | 15886394 |
| 0.24 | -1.427 | 87562319 | -82104749 | 60301841 | 73891367 | 43737832 | 104882886 | -96678344 | 29230004 |
| 0.28 | -1.273 | 116104546 | -79528254 | 79044717 | 96169221 | 56232291 | 132647802 | -93979203 | 40473544 |
| 0.34 | -1.079 | 152110893 | -75783195 | 103031880 | 124906019 | 72743689 | 171749503 | -88650325 | 55464969 |
| 0.4 | -0.916 | 179517812 | -72785472 | 121812946 | 148166521 | 85797098 | 201148735 | -84170877 | 66958048 |
| 0.5 | -0.693 | 217116419 | -67506536 | 146125004 | 177185971 | 102290755 | 239283701 | -76427493 | 83488895 |
| 0.63 | -0.462 | 249137168 | -60897291 | 167678017 | 202539042 | 116657881 | 273352679 | -66770571 | 96802344 |
| 0.8 | -0.223 | 275501046 | -52017966 | 184191946 | 222538656 | 128325242 | 299508721 | -55681124 | 108087289 |

TABLE 8B

| τ | ln τ | R | C | B60 | A | B | RM | CM | S |
|---|---|---|---|---|---|---|---|---|---|
| 1 | 0.000 | 291829682 | -42618969 | 195925467 | 235659237 | 135532234 | 316575919 | -42470387 | 116083938 |
| 1.2 | 0.182 | 300258959 | -32698550 | 201548659 | 242688632 | 139932258 | 325185911 | -31615145 | 121447452 |
| 1.4 | 0.336 | 304940602 | -24209943 | 204820673 | 245893913 | 142242613 | 329995836 | -20061628 | 123886477 |
| 1.7 | 0.531 | 307848790 | -11918668 | 206835033 | 248369851 | 143520726 | 333431390 | -3673180 | 127135288 |
| 2 | 0.693 | 308963597 | 161159 | 208421658 | 249206044 | 144491414 | 335334199 | 9870489 | 128909196 |
| 2.4 | 0.675 | 310445549 | 15231321 | 208795230 | 249848942 | 145496375 | 336432566 | 28112821 | 131501519 |
| 2.8 | 1.030 | 310947396 | 27793201 | 209159901 | 249979498 | 145379413 | 335330533 | 45396951 | 133530821 |
| 3.33 | 1.203 | 310654927 | 43188908 | 210714058 | 250495564 | 146006546 | 336681032 | 65164019 | 135229935 |
| 4 | 1.386 | 311571293 | 60898774 | 210677854 | 250809811 | 146335767 | 336665750 | 86187941 | 137458635 |
| 4.8 | 1.569 | 311781927 | 78226211 | 211439853 | 250627829 | 146800767 | 337418406 | 107885087 | 139164470 |
| 5.7 | 1.740 | 312366530 | 94478646 | 211327024 | 250865153 | 146944574 | 337460405 | 127837716 | 141752403 |
| 6.7 | 1.902 | 312518491 | 109788512 | 212477081 | 251059662 | 147345928 | 339521961 | 145959475 | 143414800 |
| 8 | 2.079 | 312882730 | 125459886 | 212165002 | 250913879 | 147769648 | 340115510 | 163015193 | 145066258 |
| 9.5 | 2.251 | 312919959 | 138647038 | 212773247 | 250965416 | 148624774 | 339047018 | 177998842 | 146464492 |
| 11.3 | 2.425 | 313148134 | 148583610 | 213621765 | 250972876 | 148637428 | 339312823 | 189233962 | 147952404 |
| 13.5 | 2.603 | 313050094 | 157178025 | 213944848 | 250824881 | 148972925 | 340599719 | 198361336 | 148970392 |
| 16 | 2.773 | 312696454 | 162353123 | 213768759 | 251096508 | 149040386 | 339743597 | 204352768 | 149645023 |
| 20 | 2.996 | 313460833 | 167277368 | 214162944 | 250875496 | 148988150 | 339599694 | 208849756 | 150485508 |
| 30 | 3.401 | 313132829 | 170076590 | 214191805 | 251668512 | 148492521 | 340080668 | 211081068 | 151491570 |
| 45 | 3.807 | 313588462 | 170437341 | 214210897 | 251911385 | 149339653 | 341044614 | 211579762 | 152491121 |
| 90 | 4.500 | 314249774 | 170971176 | 214106925 | 251423359 | 149123683 | 339633998 | 211407963 | 153735886 |

The longitudinal relaxation curves obtained as Table 8A and Table 8B concerning the eight glycine samples were analyzed using the following formula.

$$\sum_{i=1}^{n} f_i'\left(1 - 2e^{-e^{(s-S_i)}}\right) + C \quad \text{[Formula 5]}$$

Four kinds of constituents of glycine were found (in the formula, n=4).

Table 9 shows calculation results of the estimate value and the standard error of longitudinal relaxation time Si.

TABLE 9

| | Estimate value | Standard error |
|---|---|---|
| S1 | -1.47435 | 0.00294 |
| S2 | -1.23516 | 0.00145 |
| S3 | -8.62947 | 0.07122 |
| S4 | -6.76086 | 0.13573 |

Table 10 shows calculation results of the estimate value of coefficient fi and the estimate value of constant C.

TABLE 10

(Estimate value)

| | R | C | B60 | A | B | RM | CM | S |
|---|---|---|---|---|---|---|---|---|
| f1 | 3922485.6 | 132436248.0 | 4845862.1 | 1966110.7 | 3421986.3 | 3534487.9 | 160862124.9 | 17783980.6 |
| f2 | 248580234.3 | 0.0 | 165025866.7 | 197161612.9 | 113595157.9 | 262613325.4 | 5485826.2 | 101211592.1 |
| f3 | 13665971.4 | 7488055.0 | 10813062.3 | 12107575.6 | 7197262.2 | 18532940.9 | 19078867.5 | 8871063.2 |
| f4 | 4251969.2 | 2482622.1 | 4609970.4 | 5192533.7 | 3783701.5 | 10983654.8 | 6317097.2 | 4522775.7 |
| C | 43513387.8 | 26246043.0 | 28971277.6 | 35191516.3 | 21060048.4 | 44430862.0 | 21673356.3 | 19006253.5 |

Table 11 shows calculation results of the standard error of coefficient fi and the standard error of constant C.

TABLE 11

(Standard error)

| | R | C | B60 | A | B | RM | CM | S |
|---|---|---|---|---|---|---|---|---|
| f1 | 272398.7 | 261636.2 | 259644.0 | 263914.2 | 254269.2 | 274354.3 | 253067.3 | 253308.7 |
| f2 | 268333.2 | 137389.4 | 267470.3 | 267977.6 | 266844.8 | 273505.6 | 306494.6 | 267576.6 |
| f3 | 867923.3 | 760065.1 | 867058.6 | 904499.8 | 809440.1 | 1322765.3 | 1025698.5 | 851605.7 |
| f4 | 812400.7 | 612089.3 | 774466.6 | 824241.1 | 681169.9 | 1259579.6 | 1029641.4 | 737513.3 |
| C | 390317.9 | 404307.8 | 378943.8 | 382350.8 | 370697.5 | 399695.0 | 418530.0 | 373790.3 |

From these results, values of the longitudinal relaxation time T1 of the glycine constituents were determined as T1=4.37 s (assigned to γ type), T1=0.29 s (assigned to α type), T1=1.15 ms (assignment unknown), and T1=0.18 ms (assignment unknown).

Additionally, the constituent ratio of each sample was determined as in Table 12, using the strength coefficient fi. Additionally, the ±95% confidence interval was calculated at the same time.

TABLE 12

| T1 | R | C | B60 | A | B | RM | CM | S |
|---|---|---|---|---|---|---|---|---|
| 4.37 s | 1.45 ± 0.20% | 93.00 ± 0.36% | 2.62 ± 0.28% | 0.91 ± 0.24% | 2.67 ± 0.39% | 1.20 ± 0.18% | 83.89 ± 0.26% | 13.43 ± 0.36% |
| 0.29 s | 91.92 ± 0.20% | 0.00 ± 0.19% | 89.06 ± 0.28% | 91.10 ± 0.24% | 88.75 ± 0.41% | 88.82 ± 0.18% | 2.86 ± 0.31% | 76.45 ± 0.40% |
| 1.15 ms | 1.57 ± 0.59% | 1.74 ± 0.85% | 2.49 ± 0.82% | 2.40 ± 0.75% | 2.96 ± 1.05% | 3.71 ± 0.84% | 3.29 ± 1.06% | 3.42 ± 1.10% |
| 0.18 ms | 5.05 ± 0.63% | 5.26 ± 1.05% | 5.84 ± 0.92% | 5.59 ± 0.82% | 5.62 ± 1.24% | 6.27 ± 0.88% | 9.95 ± 1.05% | 6.70 ± 1.27% |

(Estimate value ±95% confidence interval)

In this way, the constituent ratio of the solid crystal polymorphs of glycine was able to be determined with high accuracy. The longitudinal relaxation time of each constituent, as well as the constituent ratio, was able to be measured at the same time.

The invention claimed is:

1. A nuclear magnetic resonance measuring method for solid samples, the method comprising the steps of: exciting nuclear spins of a solid sample placed in a static magnetic field by causing an exciting pulse to flow through a coil; receiving an FID signal (Free Induction Decay signal) from the excited nuclear spins after applying a reading pulse after a lapse of time t from an end of application of the exciting pulse; and obtaining a DIR (Delayed Inversion Recovery)-PMR (Proton Magnetic Resonance) spectrum by subjecting the FID signal to a frequency conversion process, wherein the FID signal frequency conversion process starts after a lapse of reception delay time after an end of application of the reading pulses, and wherein water being present in and around the solid sample is caught by a water molecule trapping mechanism that traps water molecules through atmosphere during measurement.

2. The nuclear magnetic resonance measuring method for solid samples according to claim 1, wherein the exciting pulse is a 180-degree pulse, and the reading pulse is a 90-degree pulse.

3. The nuclear magnetic resonance measuring method for solid samples according to claim 1, wherein the reception delay time is set at a value falling within a range of 5 microseconds to 20 microseconds.

4. The nuclear magnetic resonance measuring method for solid samples according to claim 3, wherein the reception delay time is set at a value falling within a range of 10 microseconds to 15 microseconds.

5. The nuclear magnetic resonance measuring method for solid samples according to claim 1, further comprising a step of acquiring a plurality of FID signals while changing a period of time t, a step of calculating DIR-PMR spectra based on these FID signals, a step of obtaining a longitudinal relaxation curve by plotting spectrum strength with respect to time t in a specific frequency of the DIR-PMR spectrum, and a step of making a regression analysis while regarding the longitudinal relaxation curve as a total sum of a plurality of longitudinal relaxation curves differing in longitudinal relaxation time, whereby a constituent ratio of constituent substances of the solid sample is estimated.

6. A nuclear magnetic resonance measuring method for solid samples, the method comprising the steps of: exciting nuclear spins of a solid sample placed in a static magnetic field by causing an exciting pulse to flow through a coil; receiving an FID signal (Free Induction Decay signal) from the excited nuclear spins after applying a reading pulse after a lapse of time t from an end of application of the exciting pulse; and obtaining a DIR (Delayed Inversion Recovery)-PMR (Proton Magnetic Resonance) spectrum by subjecting the FID signal to a frequency conversion process, further comprising the steps of:
acquiring a plurality of FID signals while changing the period of time t,
calculating DIR-PMR spectra based on these FID signals wherein each of the DIR-PMR spectrum is applied by a digital smoothing filter to remove noise,
obtaining a longitudinal relaxation curve by plotting spectrum strength with respect to time t in a specific frequency of the DIR-PMR spectrum, and
making a regression analysis while regarding the longitudinal relaxation curve as a total sum of a plurality of longitudinal relaxation curves differing in longitudinal relaxation time, thereby estimating a constituent ratio of constituent substances of the solid sample.

7. The nuclear magnetic resonance measuring method for solid samples according to claim 6, wherein the exciting pulse is a 180-degree pulse, and the reading pulse is a 90-degree pulse.

8. The nuclear magnetic resonance measuring method for solid samples according to claim 6, wherein the constituent ratio of the solid sample is determined by analyzing the longitudinal relaxation curve according to a nonlinear least-squares method and by calculating a strength coefficient with respect to each constituent.

9. The nuclear magnetic resonance measuring method for solid samples according to claim 8, wherein the constituent ratio of the solid sample and the longitudinal relaxation time of each constituent are calculated simultaneously.

10. The nuclear magnetic resonance measuring method for solid samples according to claim 6, wherein a correct 0th-order phase is found by simultaneously adjusting a 0th-order phase and a baseline of the FID signal, thereby obtaining an FID signal that has undergone a phase adjustment.

11. The nuclear magnetic resonance measuring method for solid samples according to claim 6, wherein the longitudinal relaxation curve is produced by use of an integral value of spectrum strength in a specific frequency range instead of spectrum strength in a specific frequency.

12. A nuclear magnetic resonance measuring method for solid samples, the method comprising the steps of: exciting nuclear spins of a solid sample placed in a static magnetic field by causing an exciting pulse to flow through a coil; receiving an FID signal (Free Induction Decay signal) from the excited nuclear spins after applying a reading pulse after a lapse of time t from an end of application of the exciting pulse; and obtaining a DIR (Delayed Iverson Recovery)-PMR (Proton Magnetic Resonance) spectrum by subjecting the FID signal to a frequency conversion process, further comprising the steps of:

acquiring a plurality of FID signals while changing the period of time t,
pre-applying a smoothing process to the FID signals along a time axis,
calculating DIR-PMR spectra based on these FID signals,
obtaining a longitudinal relaxation curve by plotting spectrum strength with respect to time tin a specific frequency of the DIR-PMR spectrum, and
making a regression analysis while regarding the longitudinal relaxation curve as a total sum of a plurality of longitudinal relaxation curves differing in longitudinal relaxation time, thereby estimating a constituent ratio of constituent substances of the solid sample.

* * * * *